United States Patent
Jung

(10) Patent No.: US 10,937,821 B2
(45) Date of Patent: Mar. 2, 2021

(54) IMAGE SENSOR HAVING GRID PATTERNS EMBEDDED IN ANTI-REFLECTIVE LAYER

(71) Applicant: SK hynix Inc., Icheon-si (KR)

(72) Inventor: Woo-Yung Jung, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/219,015

(22) Filed: Dec. 13, 2018

(65) Prior Publication Data
US 2019/0386049 A1   Dec. 19, 2019

(51) Int. Cl.
| | | |
|---|---|---|
| *H01L 27/146* | (2006.01) | |
| *H04N 5/376* | (2011.01) | |
| *H04N 5/3745* | (2011.01) | |
| *H04N 5/378* | (2011.01) | |

(52) U.S. Cl.
CPC .... *H01L 27/14623* (2013.01); *H01L 27/1463* (2013.01); *H01L 27/14621* (2013.01); *H01L 27/14627* (2013.01); *H01L 27/14643* (2013.01); *H04N 5/378* (2013.01); *H04N 5/3765* (2013.01); *H04N 5/37455* (2013.01)

(58) Field of Classification Search
CPC ................................................ H01L 27/14621
See application file for complete search history.

(56) References Cited

U.S. PATENT DOCUMENTS

| | | | |
|---|---|---|---|
| 8,319,301 B2 * | 11/2012 | Tai | H01L 27/14621 257/432 |
| 9,373,732 B2 * | 6/2016 | Velichko | H01L 31/02327 |
| 10,276,620 B2 * | 4/2019 | Chien | H01L 27/1464 |
| 2006/0081898 A1 * | 4/2006 | Wang | H01L 27/14621 257/291 |
| 2008/0036020 A1 * | 2/2008 | Ko | H01L 27/14627 257/431 |
| 2009/0295953 A1 * | 12/2009 | Nozaki | H01L 27/14627 348/294 |
| 2010/0038740 A1 * | 2/2010 | Fereyre | H01L 27/1464 257/437 |
| 2011/0108938 A1 * | 5/2011 | Nozaki | H01L 27/14629 257/432 |
| 2014/0110809 A1 * | 4/2014 | Kitamura | H01L 27/1464 257/435 |
| 2014/0339665 A1 | 11/2014 | Tani | |
| 2015/0115382 A1 * | 4/2015 | Wu | H01L 21/31144 257/432 |
| 2015/0130007 A1 | 5/2015 | Kawamura | |
| 2015/0187826 A1 * | 7/2015 | Suzuki | H04N 9/045 348/281 |
| 2017/0125462 A1 * | 5/2017 | Yu | H01L 27/14636 |

* cited by examiner

*Primary Examiner* — Eugene Lee
(74) *Attorney, Agent, or Firm* — Perkins Coie LLP

(57) ABSTRACT

An image sensor may include: photoelectric conversion elements formed in a substrate, and isolation regions disposed between the photoelectric conversion elements; an anti-reflective layer formed over the substrate; grid patterns formed over the anti-reflective layer; color filters between the grid patterns; and microlenses formed over the color filters. Each of the grid patterns may include an upper grid portion and a lower grid portion, and the bottom of the lower grid portion is embedded in the anti-reflective layer.

16 Claims, 22 Drawing Sheets

IMAGE SENSOR HAVING GRID PATTERNS EMBEDDED IN ANTI-REFLECTIVE LAYER

CROSS-REFERENCE TO RELATED APPLICATION

This patent document claims the priority and benefits under 35 U.S.C. § 119 to Korean Patent Application No. 10-2018-0070099 filed on Jun. 19, 2018, which is incorporated herein by reference in its entirety.

TECHNICAL FIELD

The technology and implementations disclosed in this document relate to an image sensor having grid patterns between adjacent color filters, and a method for fabricating the same.

BACKGROUND

With the recent development of information communication industry and the digitalization of electronic devices, enhanced image sensors are used in various fields such as a digital camera, camcorder, mobile phone, personal communication system (PCS), game machine, security camera and medical micro-camera. In general, an image sensor has a pixel region including photodiodes that generate photoelectrons in response to an incident light and a peripheral region that processes signals corresponding to the generated photoelectrons. A unit pixel includes a photodiode and a transfer transistor. The transfer transistor is positioned between the photodiode and a floating diffusion region, and transfers a charge generated by the photodiode to the floating diffusion region.

SUMMARY

Various embodiments provide an image sensor having grid patterns embedded in an anti-reflective layer.

Also, various embodiments provide an image sensor having side reflective layers formed on side surfaces of grid patterns.

Also, various embodiments provide an image sensor including an anti-reflective layer and isolation regions which are materially continuous with each other.

Also, various embodiments provide an image sensor including a coating layer formed conformally on the top surface of an anti-reflective layer and the surface of a grid pattern.

Also, various embodiments provide a camera system including the above-described image sensor.

Also, various embodiments provide a method for fabricating an image sensor having grid patterns embedded in an anti-reflective layer.

Also, various embodiments provide a method for fabricating side reflective layers formed on side surfaces of grid patterns.

Also, various embodiments provide a method for fabricating an image sensor including an anti-reflective layer and isolation regions which are materially continuous with each other.

Also, various embodiments provide a method for fabricating an image sensor including a coating layer formed conformally on the top surface of an anti-reflective layer and the surface of a grid pattern.

In an embodiment, an image sensor may include: photoelectric conversion elements formed in a substrate, each photoelectric conversion element responsive to light to produce a photo sensing electrical signal; isolation regions disposed between adjacent photoelectric conversion elements and configured to isolate the photoelectric conversion elements from one another; an anti-reflective layer formed over the substrate to reduce an optical reflection to facilitate optical transmission of light incident to the photoelectric conversion elements through the anti-reflective layer; grid patterns formed over the anti-reflective layer to separate space above the photoelectric conversion elements through which incident light is received by the photoelectric conversion elements; and color filters arranged between the grid patterns, each color filter structured to select a designated color in the incident light to transmit through a corresponding photoelectric conversion element; and microlenses respectively formed over the color filters to direct incident light to the photoelectric conversion elements through the color filters. Each of the grid patterns may include an upper grid portion disposed below the upper grid portion, and a lower grid portion, and the bottom of the lower grid portion is embedded in the anti-reflective layer.

The upper grid portion may have a larger horizontal width that the lower grid portion.

The side surface of the upper grid portion may have a first inclination. The side surface of the lower grid portion may have a second inclination. The second inclination may be more perpendicular to a surface of the substrate than the second inclination.

The image sensor may further include side reflective layers formed on both side surfaces of the grid patterns.

The side reflective layers may be in contact with the color filters.

The side reflective layers may have a smaller refractive index than that of the color filters.

The top surface of the upper grid portion may have substantially the same horizontal width as the side reflective layer.

The side reflective layer may have vertically flat side surfaces.

The average horizontal thickness of the upper portion of the side reflective layer may be smaller than the average horizontal thickness of the lower portion of the side reflective layer.

The image sensor may further include a coating layer formed in a liner shape on the top surface of the anti-reflective layer and the surfaces of the grid patterns.

The side reflective layer may have a lower refractive index than that the coating layer.

Each of the isolation regions may include a lower isolation region and an upper isolation region. The lower isolation region may include an ion implanted region. The upper isolation region may include unit isolation regions formed in an isolation trench formed in the substrate.

The unit isolation regions may include an outer unit isolation region, a middle unit isolation region and an inner unit isolation region that are formed in the isolation trench. The outer unit isolation region may cover the side surface of the middle unit isolation region, and the middle unit isolation region may cover the side surface of the inner unit isolation region.

The anti-reflective layer may include a lower unit anti-reflective layer, a middle unit anti-reflective layer and an upper unit anti-reflective layer.

The lower unit anti-reflective layer and the outer unit isolation region may include a first material, the middle unit anti-reflective layer and the middle unit isolation region may include a second material, and the upper unit anti-reflective layer and the inner unit isolation region may include a third material.

In an embodiment, an image sensor may include: photoelectric conversion elements formed in a substrate, and isolation regions disposed between the photoelectric conversion elements; an anti-reflective layer formed over the substrate; grid patterns formed over the anti-reflective layer; a side reflective layer formed on side surfaces of the grid patterns; color filters between the grid patterns; and microlenses formed over the color filters. The side reflective layer may have a lower refractive index than that of the color filters.

The bottoms of the grid patterns may be embedded in the anti-reflective layer.

The image sensor may further include a coating layer formed between the grid patterns and the side reflective layer.

The coating layer may be extended onto the top surface of the anti-reflective layer.

The isolation region may include an outer unit isolation region, a middle unit isolation region and an inner unit isolation region that are formed in an isolation trench formed in the substrate. The anti-reflective layer may include a lower unit anti-reflective layer, a middle unit anti-reflective layer and an upper unit anti-reflective layer.

The lower unit anti-reflective layer and the outer unit isolation region may include a first, the middle unit anti-reflective layer and the middle unit isolation region may include a second material, and the upper unit anti-reflective layer and the inner unit isolation region may include a third material.

In an embodiment, an image sensor may include: photoelectric conversion elements formed in a substrate, and isolation regions between the photoelectric conversion elements; an anti-reflective layer formed over the substrate; grid patterns formed over the anti-reflective layer, and color filters between the grid patterns; and microlenses formed over the color filters. Each of the grid patterns may include an upper grid portion and a lower grid portion, and the bottom of the lower grid portion is embedded in the anti-reflective layer.

In an embodiment, an image sensor may include: photoelectric conversion elements formed in a substrate, and isolation regions between the photoelectric conversion elements; an anti-reflective layer formed over the substrate; grid patterns formed over the anti-reflective layer; a side reflective layer formed on side surfaces of the grid patterns; color filters between the grid patterns; and microlenses formed over the color filters. The side reflective layer may have a lower refractive index than that of the color filters.

DETAILED DESCRIPTION

Figure 1:
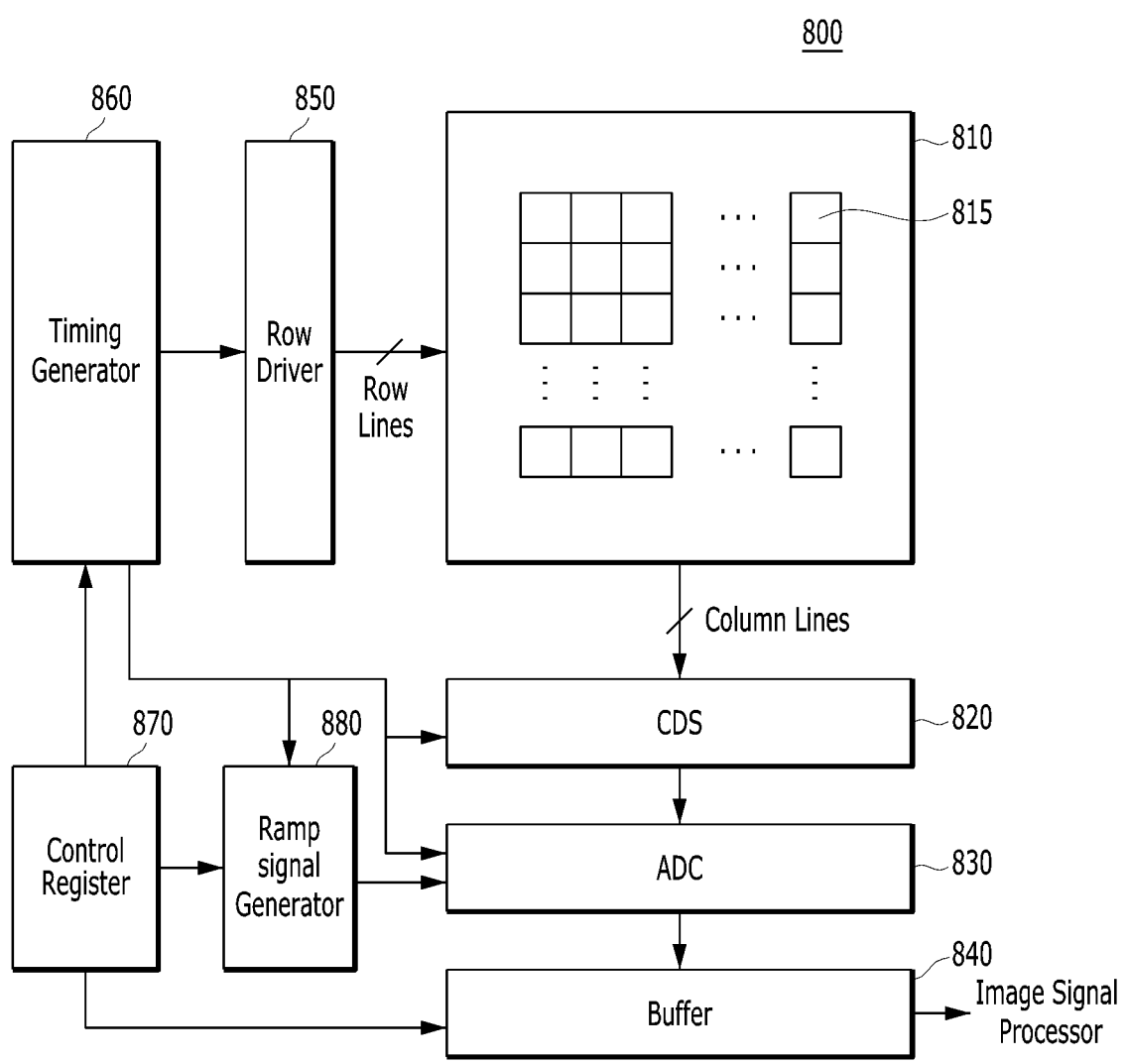
FIG. 1 is an example of a block diagram schematically illustrating an image sensor in accordance with an embodiment of the disclosed technology.

The disclosed technology can be implemented to provide an image sensor exhibiting improved characteristics. In some implementations, the disclosed image sensor can prevent or reduce undesired characteristics such as cross-talk occurring between adjacent pixels. For example, the disclosed technology suggests grid patterns that are structured to help to reduce an amount of light that is originally incident on a first pixel but transferred to a second pixel adjacent to the first pixel. In some implementations, the disclosed technology can be further implemented to improve the quantum efficiency of the image sensor.

Throughout the specification, the same reference numerals refer to like elements. Thus, although the same or similar reference numerals are not mentioned or described in the corresponding drawing, the reference numerals may be described with reference to other drawings. Furthermore, although elements are not represented by reference numerals, the elements may be described with reference to other drawings.

FIG. 1 is an example of a block diagram schematically illustrating an image sensor 800 in accordance with an embodiment. Referring to FIG. 1, the image sensor in accordance with the present embodiment may include a pixel array 810, a correlated double sampler (CDS) 820, an analog-digital converter (ADC) 830, a buffer 840, a row driver 850, a timing generator 860, a control register 870 and a ramp signal generator 880.

The pixel array 810 may include a plurality of pixels arranged in rows and columns in a matrix structure. Each pixel block 815 may include a block of imaging pixels each of which may include at least one photosensing element that converts light into electrical charge, a voltage or current signal and such a photosensing element may be implemented by a photo diode, a photo transistor, a photo gate, or other photosensitive circuitry capable of converting light into a pixel signal (e.g., charge, a voltage or a current). The plurality of pixels may convert optical image information into electrical image signals and transfer the electrical image signals to the CDS 820 through corresponding column lines. Each of the plurality of pixels may be coupled to one of row lines and one of the column lines.

The CDS 820 may hold and sample the electrical image signals received from the pixels of the pixel blocks 815 within the pixel array 810. For example, the CDS 820 may sample a reference voltage level and the voltage level of a received electrical image signal from the pixel blocks 815 according to a clock signal provided from the timing generator 860 and transfer an analog signal corresponding to a difference therebetween to the ADC 830.

The ADC 830 may convert the received analog signal into a digital signal representing the electrical image signal from a particular pixel block 815 and transfer the digital signal to the buffer 840.

The buffer 840 may latch or hold the received digital signal, and sequentially output the latched or held signal to an image signal processor (not illustrated). The buffer 840 may include a memory for latching a digital signal and a sense amplifier for amplifying a digital signal.

The row driver 850 may drive the plurality of pixels of the pixel array 810 according to a signal of the timing generator 860. For example, the row driver 850 may generate select signals for selecting one row line among the plurality of row lines and/or driving signals for driving the row line.

The timing generator 860 may generate a timing signal for controlling the CDS 820, the ADC 830, the row driver 850 and the ramp signal generator 880.

The control register 870 may generate control signals for controlling the buffer 840, the timing generator 860 and the ramp signal generator 880.

The ramp signal generator 880 may generate a ramp signal for controlling an image signal outputted from the buffer 840 according to control of the timing generator 860.

Figure 2:
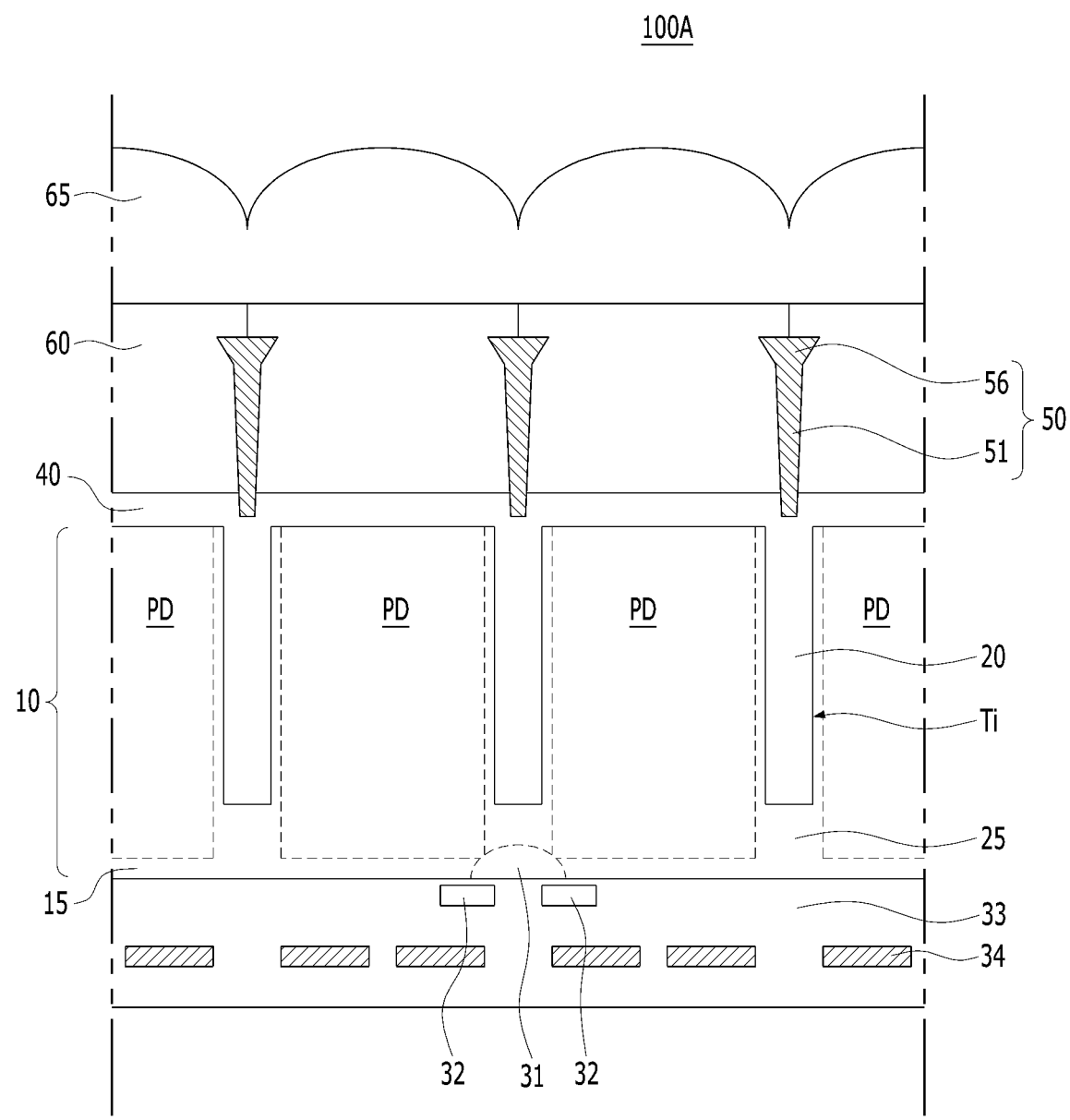
FIG. 2 is an example of a schematic longitudinal sectional view of an image sensor in accordance with an embodiment of the disclosed technology.

FIG. 2 is an example of a schematic longitudinal sectional view of an image sensor 100A in accordance with an embodiment. Referring to FIG. 2, the image sensor 100A may include photoelectric conversion elements PD, a surface doping region 15, isolation regions 20 and 25 and a floating diffusion region 31 that are formed in a substrate 10. The image sensor 100A may further include transfer gates 32, a lower interlayer dielectric layer 33 and transfer wirings 34 that are formed on the bottom surface of the substrate 10, and an anti-reflective layer 40, grid patterns 50, color filters 60 and microlenses 65 that are formed on the top surface of the substrate 10.

The substrate 10 may include a single crystal silicon wafer or epitaxially grown single crystal silicon layer. The substrate 10 may include P-type ions. The photoelectric conversion elements PD may include an ion implanted region formed in the substrate 10. For example, the photoelectric conversion elements PD may include N-type ion implanted regions which are doped with an N-type ion such as phosphorous (P) or arsenic (As). The photoelectric conversion elements PD may further include a P-type ion implanted region doped with a P-type ion such as boron (B). The photoelectric conversion elements PD may receive light and generate photocharges in response to received light. The photoelectric conversion elements PD may be implemented by a photo sensing device or circuit including a photo diode, a photo transistor, a photo gate, or other photosensitive circuitry capable of converting light into a pixel signal (e.g., a charge, a voltage or a current). The surface doping region 15 may be formed in the substrate 10 between the photoelectric conversion elements PD and the bottom surface of the substrate 10. Since the photoelectric conversion elements PD are included in the substrate as parts of the substrate 10, the photoelectric conversion elements PD are represented by dotted lines.

The isolation regions 20 and 25 may be located between adjacent photoelectric conversion elements PD or pixels and may be structured to electrically and physically isolate the photoelectric conversion elements PD from one another. The isolation regions 20 and 25 may include an upper isolation region 20 and a lower isolation region 25. The upper isolation region 20 may include an insulator which fills an isolation trench Ti formed in the substrate 10 between adjacent photoelectric conversion elements PD or pixels.

The lower isolation region 25 may include P-type ions implanted into the substrate 10 between adjacent photoelectric conversion elements PD or pixels. Under this design, the lower isolation region 25 may include P-type ion implanted regions. The bottom surface and side surfaces of the upper isolation region 20 may be covered by or interface with the lower isolation region 25. Therefore, the upper isolation regions 20 may be isolated from the photoelectric conversion elements PD.

The floating diffusion region 31 may be formed in the substrate 10 so as to abut the bottom surface of the substrate 10. The floating diffusion region 31 may include an N-type ion implanted region. The transfer gates 32 may transfer photocharges generated in the photoelectric conversion elements PD to the floating diffusion region 31. Since the floating diffusion region 31 is also part of the substrate 10, the floating diffusion region 31 is represented by a dotted line.

The lower interlayer dielectric layer 33 may be formed on the bottom surface of the substrate 10 so as to cover and surround the transfer gates 32 and the transfer wirings 34. The lower interlayer dielectric layer 33 may include an insulator such as silicon oxide. The transfer wirings 34 may include a conductor such as metal. The transfer wirings 34 may have a line shape extended in the horizontal direction.

The anti-reflective layer 40 may be formed on the top surface of the substrate 10 so as to have a flat top surface. The anti-reflective layer 40 may include dielectric materials and function to reduce the reflection of the light that is incident on the image sensing device 100 and thus can improve the efficiency in the photon-electrical energy transfer. The anti-reflective layer 40 will be described in detail later in this specification with reference to other drawings.

The grid patterns 50 may be formed over the substrate 10 to prevent undesired effects such as optical crosstalk between adjacent photoelectric conversion elements PD or pixels. The gird patterns 50 may be located above the isolation regions 20 and 25 to physically divide the space above the photoelectric conversion elements PD or pixels and may be structured to be optically opaque to provide optical isolation or separation between adjacent photoelectric conversion elements PD or pixels. In some implementations, the color filters 60 may be located to be respectively over the photoelectric conversion elements PD or pixels with one color filter over one PD or pixel, and accordingly, the grid patterns 50 may be located between two adjacent color filters 60 and have a layout to overlap the isolation regions 20 and 25 between adjacent the photoelectric conversion elements PD or pixels. As a specific example, the grid patterns 60 may have a mesh shape associated with the pattern of the array of photoelectric conversion elements PD or pixels when seen from the top. In some implementations, the grid patterns 50 may have a fence or wall shape. In some implementations, the grid patterns 50 may have a stud-shaped longitudinal sectional structure. Each of the grid patterns 50 may include a body having a relatively gently inclined side surface and a head or terminal end having a relatively steeply inclined side surface. Thus, the grid patterns 50 may have at least two portions having two different inclination profiles. In this design, the body may be referred to as a lower grid portion 51, and the head may be referred to as an upper grid portion 56. The bottom of the lower grid portion 51 may be embedded or inlaid in the anti-reflective layer 40. The upper grid portion 56 may have a flat top surface. The gird pattern 50 may include an optically opaque material including that is optically absorptive or of a property that otherwise blocks optical transmission, e.g., a metal such as tungsten (W).

Between the grid patterns 50, the color filters 60 may be formed. Low portions of the color filters 60 may be separated from each other by the grid patterns 50 and upper portions of the color filters 60 may abut each other. In this case, the upper portions of the color filters 60 may be referred to the portions of the color filters located over the upper grid portions 56 of the grid patterns 50. The microlenses 65 may be formed on the color filters 60 and optically correspond with the photoelectric conversion elements PD in the substrate 10.

Figure 3A:
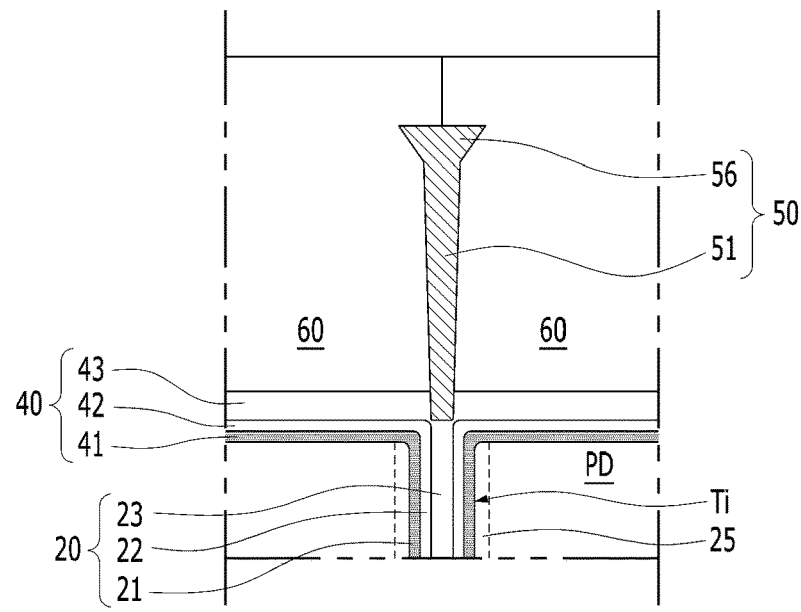
FIGS. 3A and 3B are expanded longitudinal sectional views of the image sensor illustrated in FIG. 2.
Figure 3B:
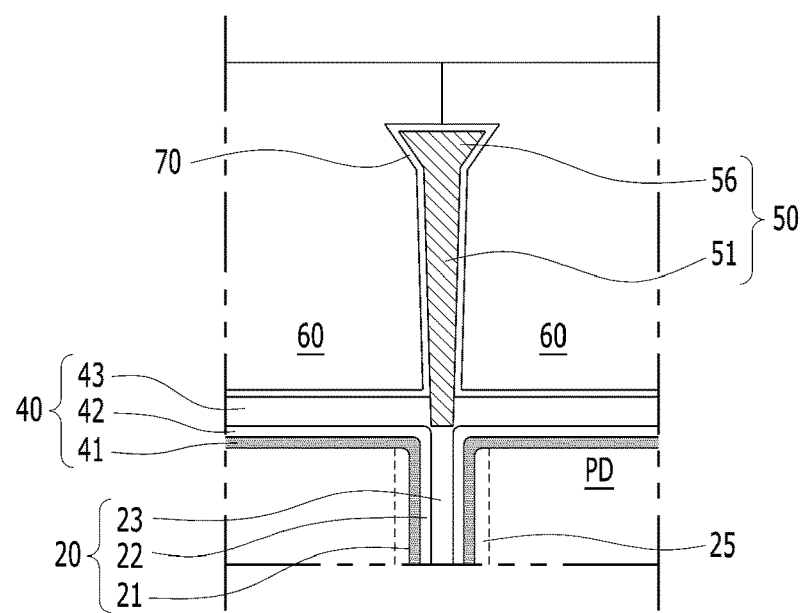

FIGS. 3A and 3B are expanded longitudinal sectional views of the image sensor 100A illustrated in FIG. 2. Referring to FIG. 3A, the anti-reflective layer 40 of the image sensor 100A include a plurality of unit anti-reflective layers 41 to 43. In some implementations, the anti-reflective layer 40 may include a lower unit anti-reflective layer 41, a middle unit anti-reflective layer 42 and an upper unit anti-reflective layer 43. For example, the lower unit anti-reflective layer 41 may include an insulator such as aluminum oxide ($Al_2O_3$). The middle unit anti-reflective layer 42 may include an insulator such as hafnium oxide ($HfO_2$). The upper unit anti-reflective layer 43 may include silicon oxide with excellent gap-fill performance such as a high aspect ratio process (HARP). As the lower unit anti-reflective layer 41 and the middle unit anti-reflective layer 42 include metal oxides, the anti-reflective layer 40 including the lower unit anti-reflective layer 41 and the middle unit anti-reflective layer 42 can pull holes and form a hole-accumulation region closer to a top surface of the photoelectric conversion elements PD as a fixed charge layer. Thus, efficiency of photo-electrical energy transfer can be improved.

The upper isolation region 20 of the image sensor 100A may include a plurality of unit isolation regions 21 to 23. Specifically, the upper isolation region 20 may include an outer unit isolation region 21, a middle unit isolation region 22 and an inner unit isolation region 23. In some implementations, the outer unit isolation region 21 may cover the side surface of the middle unit isolation region 22, and the middle unit isolation region 22 may cover the side surface of the inner unit isolation region 23. For example, the outer unit isolation region 21 may include an insulator such as aluminum oxide ($Al_2O_3$). The middle unit isolation region 22 may include an insulator such as hafnium oxide ($HfO_2$). The inner unit isolation region 23 may include silicon oxide with excellent gap-fill performance such as HARP. The outer unit isolation region 21 may be formed in a conformal liner shape on the inner wall of the isolation trench Ti. The middle unit isolation region 22 may be formed in a conformal liner shape on the outer unit isolation region 21. The inner unit isolation region 23 may fill a gap in/between the middle unit isolation regions 22. As the outer unit isolation region 21 and the middle unit isolation region 22 include metal oxides, the upper isolation region 20 including the outer unit isolation region 21 and the middle unit isolation region 22 can pull holes and form a hole-accumulation region closer to side surfaces of the photoelectric conversion elements PD as the fixed charge layer. Thus, efficiency of photo-electrical energy transfer can be improved.

The lower unit anti-reflective layer 41 and the outer unit isolation region 21 may be materially continuous with each other. Thus, the lower unit anti-reflective layer 41 and the outer unit isolation region 21 may include the same material. The middle unit anti-reflective layer 42 and the middle unit isolation region 22 may be materially continuous with each other. Thus, the middle unit anti-reflective layer 42 and the middle unit isolation region 22 may include the same material. The upper unit anti-reflective layer 43 and the inner unit isolation region 23 may be materially continuous with each other. Thus, the upper unit anti-reflective layer 43 and the inner unit isolation region 23 may include the same material.

The bottom of the lower grid portion 51 of the grid pattern 50 may be embedded or inlaid in the anti-reflective layer 40. For example, the bottom of the lower grid portion 51 of the grid pattern 50 may be positioned in the upper unit anti-reflective layer 43 of the anti-reflective layer 40. In another embodiment, the bottom of the lower grid portion 51 of the grid pattern 50 may be contacted with the middle unit anti-reflective layer 42 of the anti-reflective layer 40.

Referring to FIG. 3B, the image sensor 100A may further include a coating layer 70 formed in a conformal liner shape on the top surface of the anti-reflective layer 40 and the surface of the grid pattern 50. The coating layer 70 may include silicon oxynitride, silicon nitride, silicon oxide and/or combinations thereof. In another embodiment, the coating layer 70 may have a higher refractive index than that of the color filters 60. In another embodiment, the coating layer 70 may have a lower refractive index than that of the color filters 60.

Figure 4:
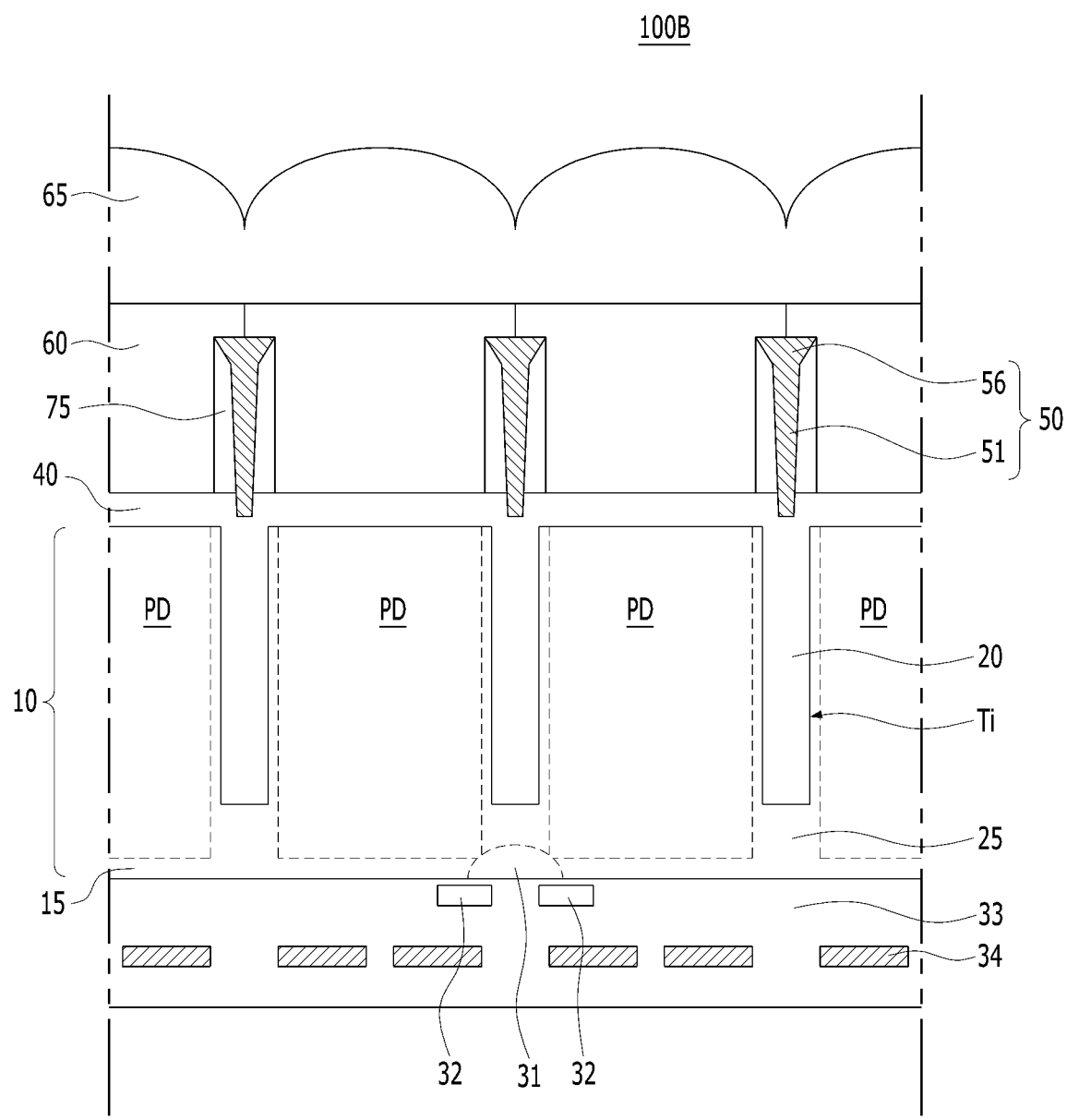
FIG. 4 is an example of a schematic longitudinal sectional view of an image sensor in accordance with an embodiment of the disclosed technology.

FIG. 4 is a schematic longitudinal sectional view of an image sensor 100B in accordance with an embodiment. Referring to FIG. 4, the image sensor 100B may further include a side reflective layer 75 formed on both side surfaces of the grid patterns 50, compared to the image sensor 100A illustrated in FIG. 2. The side reflective layer 75 will be described later in this patent document in more detail with reference to other drawings. The other components which are not specifically described in connection with FIG. 4 will be understood with reference to FIG. 2.

Figure 5A:
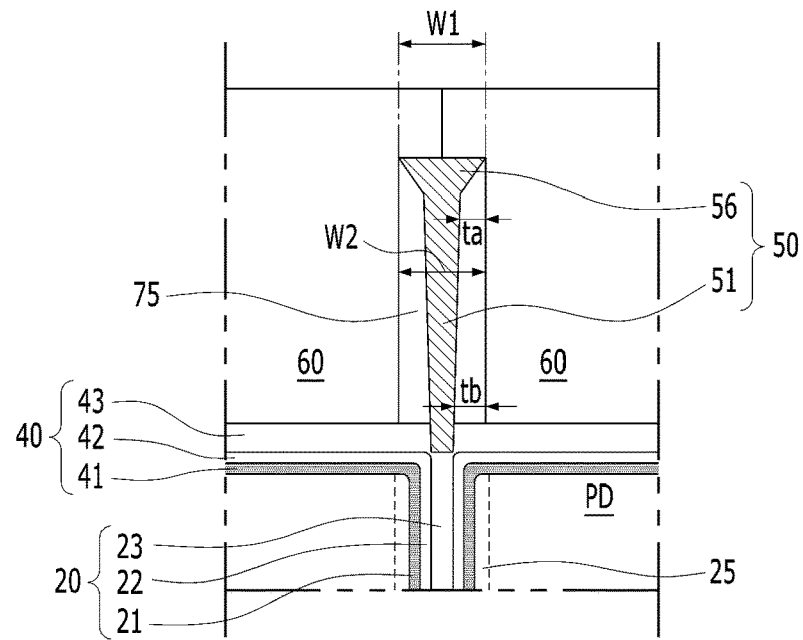
FIGS. 5A and 5B are expanded longitudinal sectional views of the image sensor illustrated in FIG. 2.
Figure 5B:
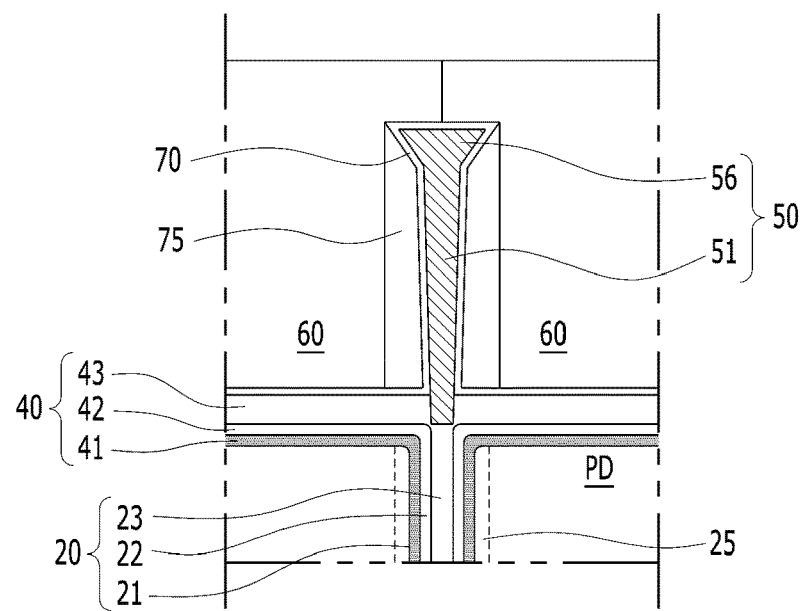

FIGS. 5A and 5B are expanded longitudinal sectional views of the image sensor 100B illustrated in FIG. 4. Referring to FIG. 5A, the image sensor 100B may further include the side reflective layer 75 formed on both side surfaces of the grid pattern 50. The side reflective layer 15 may be configured to further assist the isolation and/or the separation between adjacent pixels. In some implementations, the side reflective layer 75 may be formed on the side surfaces of the lower grid portion 51 and the upper grid portion 56 of the grid pattern 50. The side reflective layer 75 may have vertically flat outer surfaces along a direction perpendicular to a surface of the substrate 10. The size of the side reflective layer 75 may be determined in relation to the size of the grid pattern 50. For example, the width W1 of the top surface of the upper grid portion 56 of the grid pattern 50 may be similar or substantially equal to the distance W2 between the outer surfaces of the side reflective layer 75 (W1=W2). In some implementations, the average horizontal thickness ta of the upper portion of the side reflective layer 75 may be smaller than the average horizontal thickness tb of the lower portion of the side reflective layer 75 (ta<tb). This is because that the grid pattern 50 around the upper portion of the side reflective layer 75 has a shape whose width decreases in a downward direction. The side reflective layer 75 may have a lower refractive index than that of the color filter 60. Accordingly, incident light can be totally reflected at interfaces between the color filters 60 and the side reflective layer 75 and a light loss can be reduced. The side reflective layer 75 may include a polymer organic material.

Referring to FIG. 5B, the image sensor 100B may further include a coating layer 65 formed between the grid pattern 50 and the side reflective layer 75. In some implementations, the coating layer 65 may be formed in a conformal liner shape on the top surface of the anti-reflective layer 40 and the surface of the grid pattern 50. The coating layer 65 will be understood with reference to FIG. 3B. The side reflective layer 75 may have a lower refractive index than that of the coating layer 65.

Figure 6A:
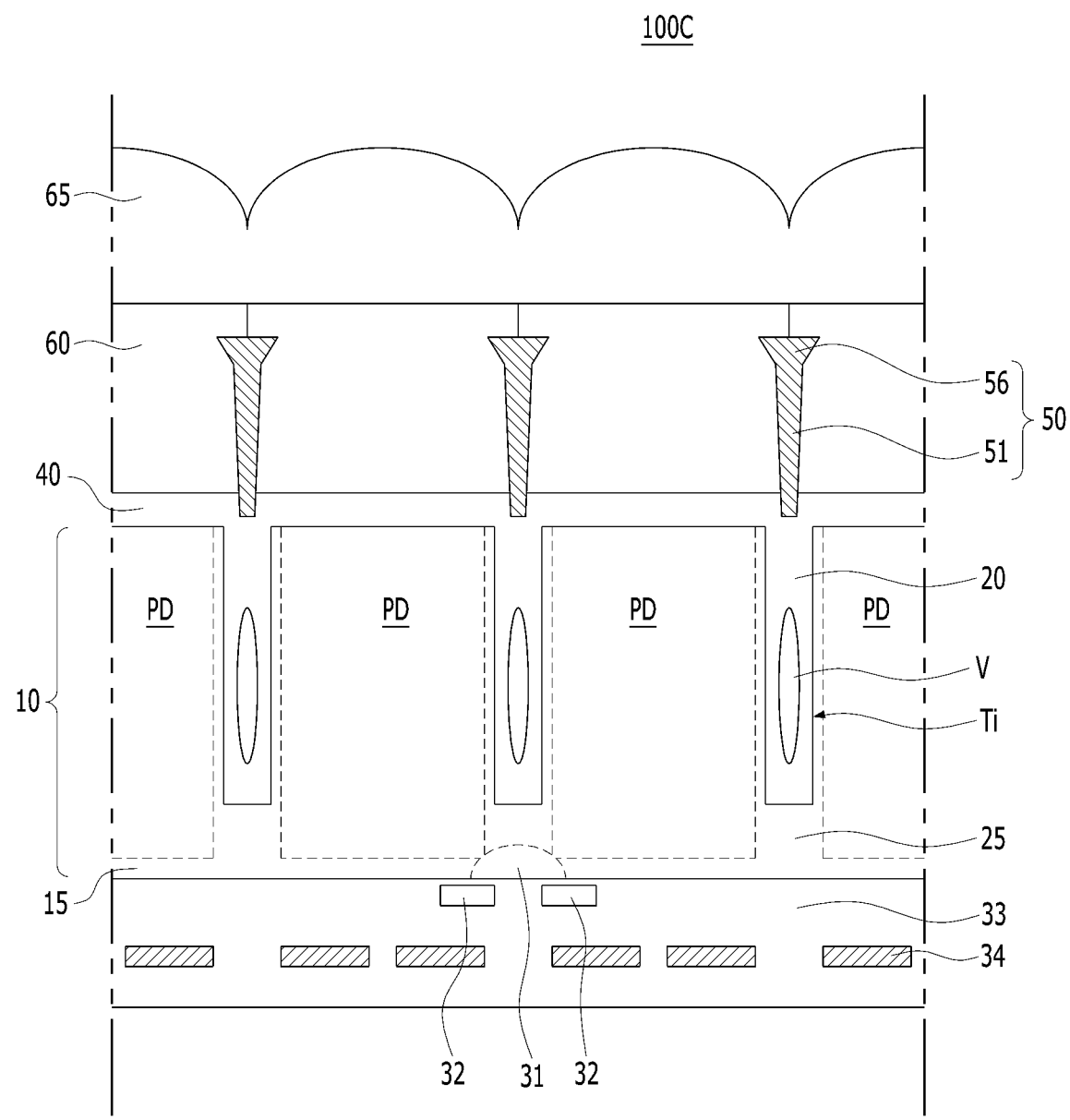
FIGS. 6A and 6B are examples of schematic longitudinal sectional views of image sensors in accordance with embodiments of the disclosed technology.
Figure 6B:
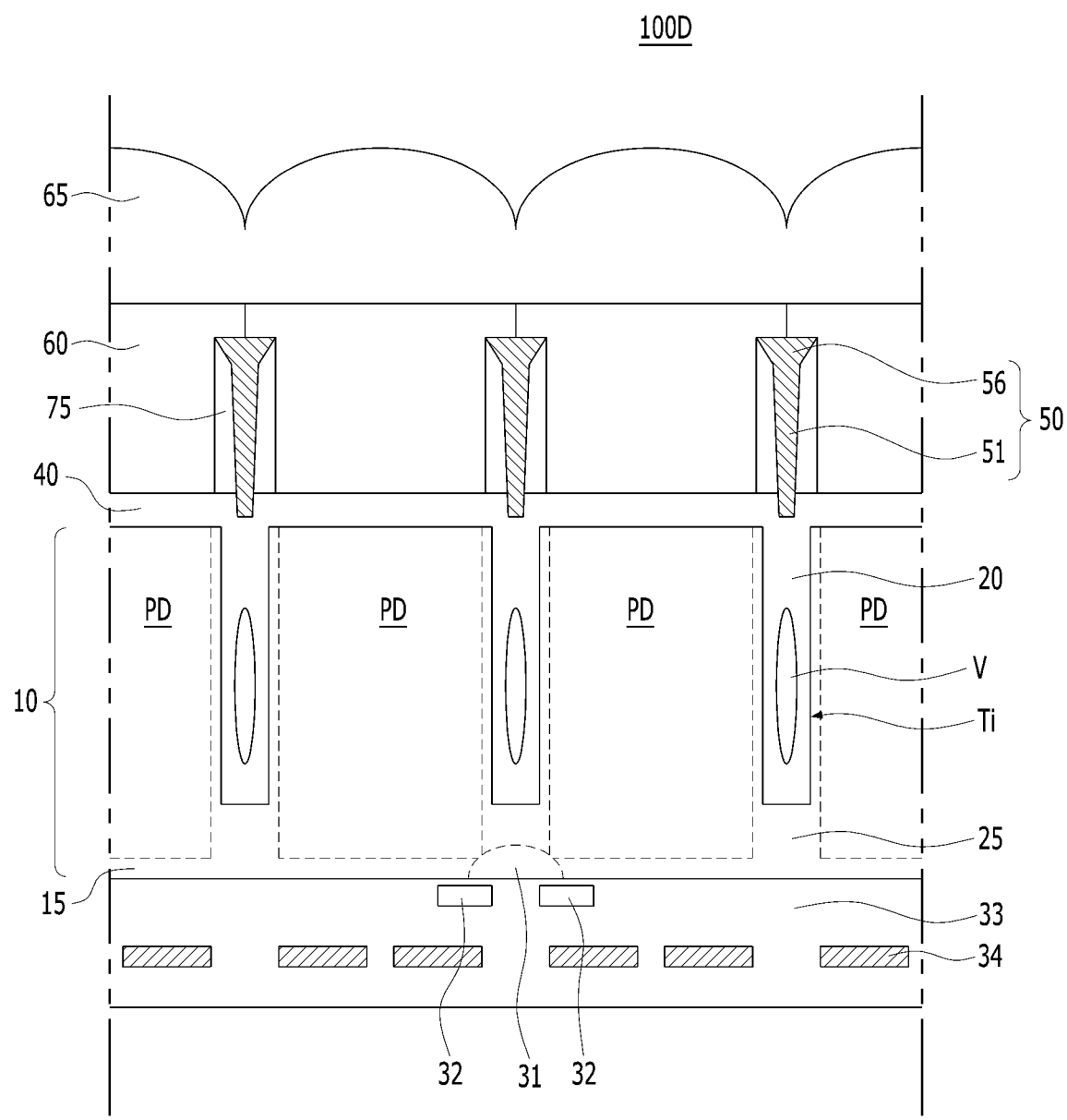

FIGS. 6A and 6B are schematic longitudinal sectional views of image sensors 100C and 100D in accordance with embodiments of the disclosed technology. Referring to FIGS. 6A and 6B, the image sensors 100C and 100D may include an upper isolation region 20 with a void V formed inside the insulator material of the upper isolation region 20. The void V may include an air gap. Referring to FIGS. 3A and 5A, the void V may be positioned in the inner unit isolation region 23 within the isolation trench Ti. In this case, the void V may be surrounded by the inner unit isolation region 23. Because the void V is the air gap, the void V has a refractive index and a dielectric permittivity lower than those of the isolation region 20 (21, 22, and 23). Accordingly, the incident light can be totally reflected an interface between the isolation region 20 and the void V. Furthermore, because of a lower parasitic capacitance of the void V, the photo-electric conversion efficiency can be improved. The components of the image sensor 100C of FIG. 6A, which are not described herein, will be able to be understood with reference to FIGS. 2, 3A and 3B, and the components of the image sensor 100D of FIG. 6B, which are not described herein, will be able to be understood with reference to FIGS. 4, 5A and 5B. That is, the image sensor 100C illustrated in FIG. 6A may further include the technical idea of the embodiment described with reference to FIGS. 3A and 3B, and the image sensor 100D illustrated in FIG. 6B may further include the technical idea of the embodiment described with reference to FIGS. 5A and 5B.

Figure 7A:
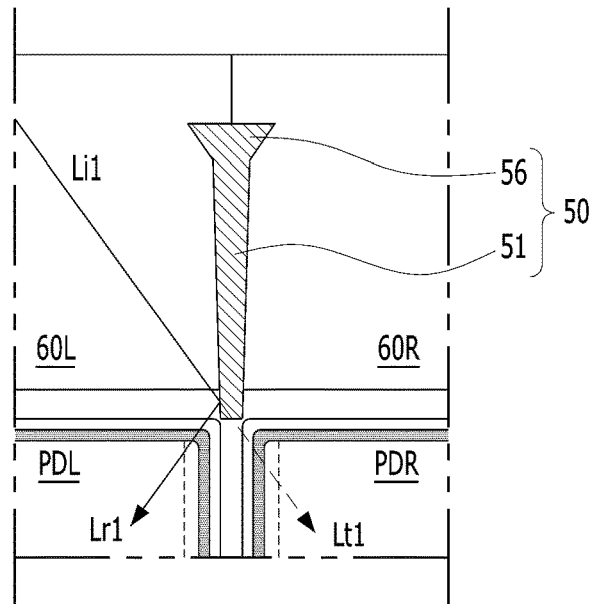
FIGS. 7A and 7B illustrate effects of image sensors in accordance with embodiment of the disclosed technology.
Figure 7B:
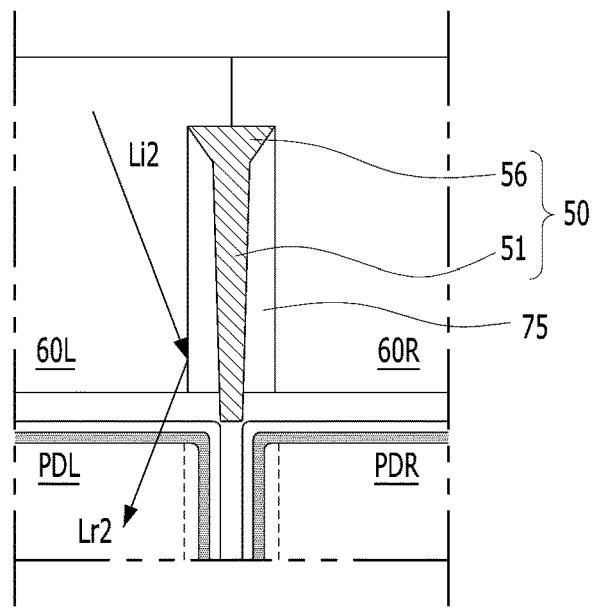

FIGS. 7A and 7B illustrate the effects of the image sensors 100A to 100D in accordance with some implementations of the disclosed technology. Referring to FIG. 7A, the image sensor may include left and right photoelectric conversion elements PDL and PDR that are arranged next to each other and left and right color filters 60L and 60R are disposed over the left and right photoelectric conversion elements PDL and PDR, respectively. As previously described in this patent document, the grid pattern 50 is arranged between the left and right color filters 60L and 60R and includes the upper grid portion 56 and the lower grid portion 51 disposed below the upper grid portion 60. The bottom portion of the lower grid portion 51 may be embedded or inlaid in the anti-reflective layer 40. The lower grid portion 51 of the grid pattern 50 embedded or inlaid in the anti-reflective layer 40 can block light Li1 obliquely incident on the left color filter 60L and prevent the incident light Li1 from being cross-incident on the right photoelectric conversion element PDR. In this case, the lower grid portion 51 of the grid pattern 50, embedded in the anti-reflective layer 40, may reflect the light Li1 obliquely incident on the left color filter 60L and the reflected light Li1 from the lower grid portion 51 of the grid pattern 50 may be incident on the left photoelectric conversion element PDL. When the lower grid portion 51 of the grid pattern 50 embedded in the anti-reflective layer 40 is not present, the light Li1 incident obliquely through the left color filter 60L may be incident on the right photoelectric conversion element PDR (indicated Lt1), thereby causing undesired cross-talk between the adjacent PDR and PDL. Since the light Lr1 reflected by the bottom of the lower grid portion 51 of the grid pattern 50, embedded in the anti-reflective layer 40, is incident on the left photoelectric conversion element PDL, cross-talk can be prevented. Symmetrically, even when the incident light Li1 passes through the right color filter 60R, the light Lr1 reflected by the bottom of the lower grid portion 51 of the grid pattern 50, embedded in the anti-reflective layer 40, can be incident on the right photoelectric conversion element PDR.

FIG. 7B shows an implementation where the side reflective layer 75 is disposed on side surfaces of the grid patterns 50. Referring to FIG. 7B, the light Li2 incident upon the left color filter 60L can be totally reflected by the side reflective layer 75 formed on the side surfaces of the grid pattern 50, and the totally reflected light Lr2 can be incident on the left photoelectric conversion element PDL. Assuming that the side reflective layer 75 is not present, the intensity of the light Lr2 reflected into the left photoelectric conversion element PDL may be reduced while the incident light Li2 is partially absorbed by the grid pattern 50. Referring to FIGS. 3B and 5B, a part of the incident light Li2 can be absorbed by the coating layer 70, which results in the decrease of the intensity of the reflected light Lr2 reflected back to the left photoelectric conversion element PDL is reduced. In the same manner, if the incident light passes through the right color filter 60R, the light can be totally reflected by the side reflective layer 75 on the side surfaces of the grid pattern 50 and the reflected light can be incident on the right photoelectric conversion element PDR. Thus, the side reflective layer 75 makes it possible to further reduce the amount of light which causes the cross-talk, thereby improving the characteristics of the image sensor.

FIGS. 8A to 8F illustrate a method for fabricating an image sensor in accordance with an embodiment.

Figure 8A:
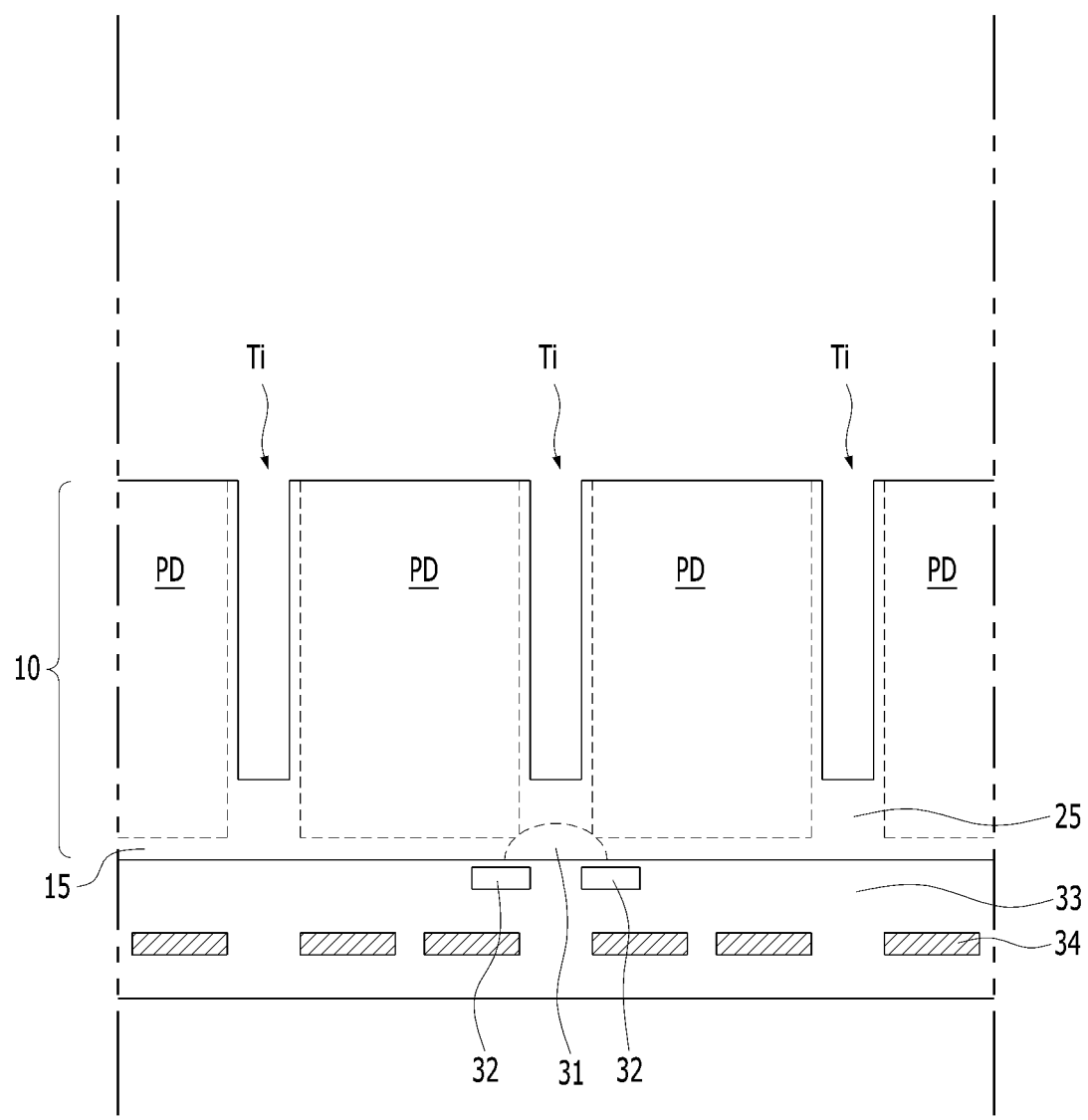
FIGS. 8A to 8F illustrate a method for fabricating an image sensor in accordance with an embodiment of the disclosed technology.

Referring to FIG. 8A, the method for fabricating the image sensor may include forming photoelectric conversion elements PD, a surface doping region 15, a lower isolation region 25, a floating diffusion region 31, transfer gates 32, a lower interlayer dielectric layer 33 and transfer wirings 34 in a substrate 10, and forming the isolation trenches Ti in the lower isolation region 25.

The substrate 10 may include a single crystal silicon wafer or epitaxially grown single crystal silicon layer.

The forming of the photoelectric conversion elements PD may include implanting N-type ions such as P or As into the substrate 10 by performing an ion implant process.

The forming of the surface doping region 15 may include implanting a P-type ion such as Boron (B) into the substrate 10 by performing an ion implant process. The surface doping region 15 may abut the bottom surface of the substrate 10.

The forming of the lower isolation region 25 may include implanting a P-type ion such as B between the photoelectric conversion elements PD in the substrate 10 by performing an ion implant process. The sequence of the process of forming the photoelectric conversion elements PD and the process of forming the surface doping region 15, and the process of forming the lower isolation region 25 may be changed.

The forming of the floating diffusion region 31 may include implanting N-type ions such as P or As into the substrate 10 by performing an ion implant process.

The forming of the transfer gates 32 may include forming a gate dielectric layer on the bottom surface of the substrate 10, forming a conductive layer on the gate dielectric layer, and patterning the conductive layer and the gate dielectric layer through a patterning process. The transfer gates 32 may include a conductor such as doped silicon, metal silicide, metal compound or metal. The forming of the lower interlayer dielectric layer 33 may include forming an insulator to cover the transfer gates 32 by performing a deposition process. The forming of the transfer wirings 34 may include a deposition process and a patterning process or damascene process. The transfer wirings 34 may have a line shape which is embedded in the lower interlayer dielectric layer 33 and horizontally extended.

The forming of the isolation trenches T1 may include forming a mask pattern (not illustrated) on the top surface of the substrate 10, and performing an etching process. The isolation trenches T1 may be isolated from the photoelectric conversion elements PD, while vertically overlapping the lower isolation regions 25.

Figure 8B:
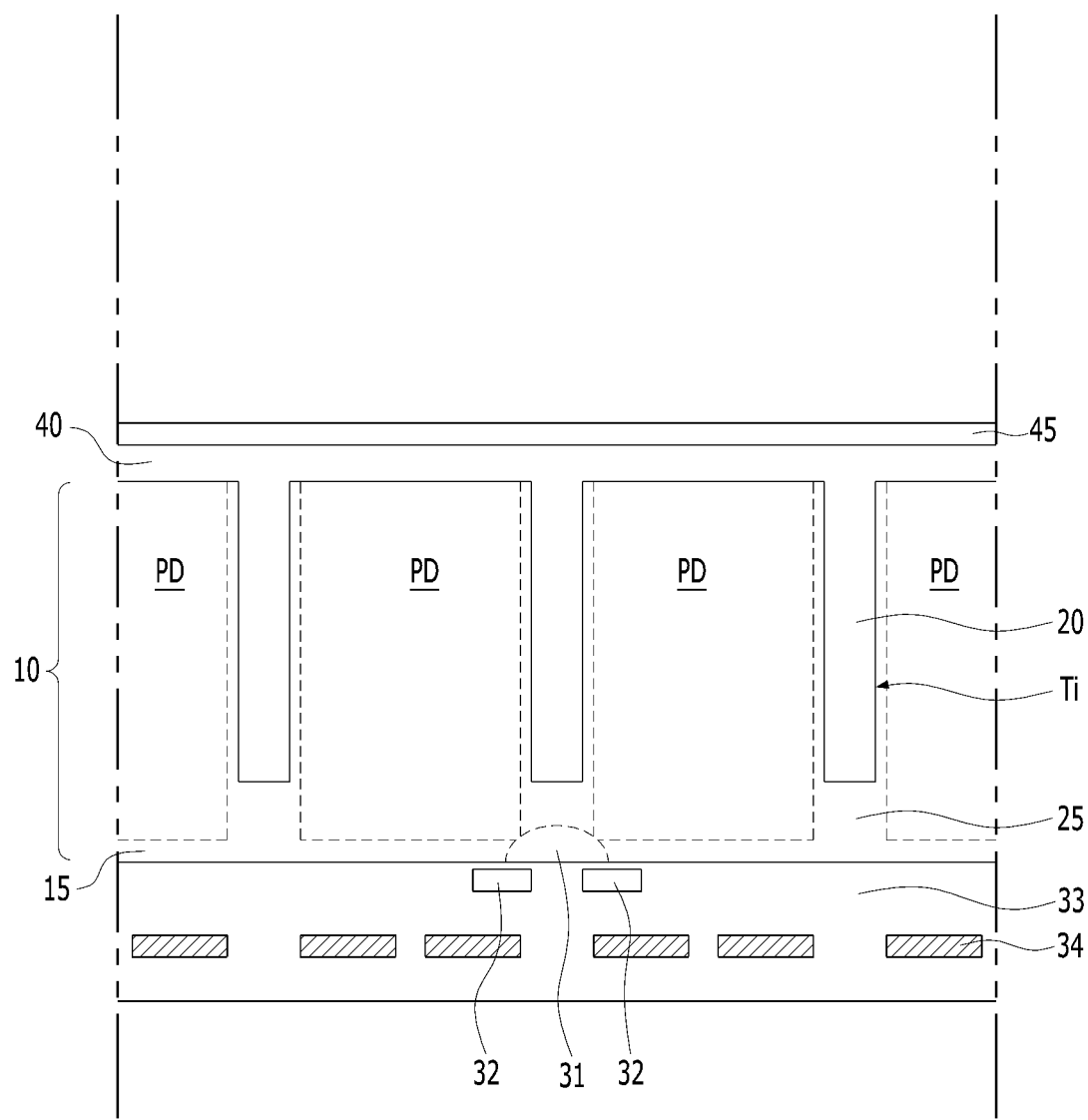

Referring to FIG. 8B, the method may include forming an anti-reflective layer 40, and forming a stopper layer 45 on the anti-reflective layer 40. The forming of the anti-reflective layer 40 may include performing a deposition process. The anti-reflective layer 40 may be formed on the substrate 10 to fill the isolation trenches Ti. The anti-reflective layer 40 may have a top surface which is flat. Referring back to FIG. 3A, the forming of the anti-reflective layer 40 may include forming the outer unit isolation region 21, the middle unit isolation region 22 and the inner unit isolation region 23 in the isolation trench Ti, and forming the lower unit anti-reflective layer 41, the middle unit anti-reflective layer 42 and the upper unit anti-reflective layer 43 on the top surface of the substrate 10. The outer unit isolation region 21 and the lower unit anti-reflective layer 41 may include the same material and be formed at the same time. For example, the outer unit isolation region 21 and the lower unit anti-reflective layer 41 may include an insulator such as aluminum oxide ($Al_2O_3$). The middle unit isolation region 22 and the middle unit anti-reflective layer 42 may include the same material and be formed at the same time. For example, the middle unit isolation region 22 and the middle unit anti-reflective layer 42 may include an insulator such as hafnium oxide ($HfO_2$). The inner unit isolation region 23 and the upper unit anti-reflective layer 43 may include the same material and be formed at the same time. For example, the inner unit isolation region 23 and the upper unit anti-reflective layer 43 may include an insulator such as silicon oxide ($SiO_2$). The stopper layer 45 may include a harder insulator than the upper unit anti-reflective layer 43, and thus have etch selectivity with respect to the upper unit anti-reflective layer 43. For example, the stopper layer 45 may include silicon nitride (SiN) or silicon oxynitride (SiON).

Figure 8C:
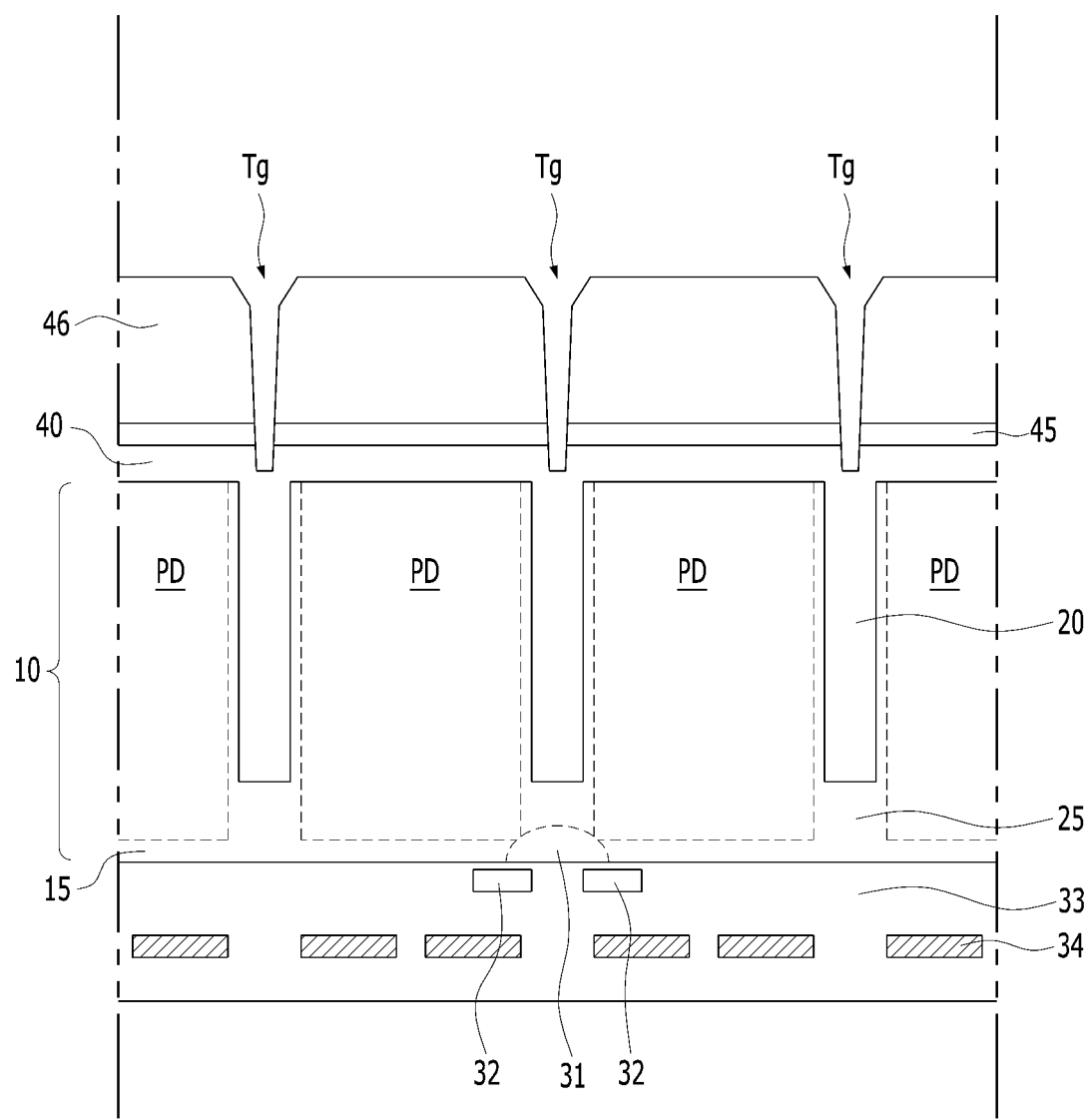

Referring to FIG. 8C, the method may include forming a mold layer 46 on the stopper layer 45, forming a mask pattern (not illustrated) on the mold layer 46, and forming grid trenches Tg by performing an etching process. The mold layer 46 may include a material different from the stopper layer 45 so as to have etch selectivity with respect to the stopper layer 45. For example, the mold layer 46 may include silicon oxide. The grid trenches Tg may have a mesh shape to overlap the isolation regions 20 and 25, when seen from the top. The grid trenches Tg may have a stud-shaped longitudinal section. For example, the grid trenches Tg may have a lower portion with a relatively small width and an upper portion with a relatively large width. The side surfaces of the grid trenches Tg may be inclined. For example, the side surfaces of the upper portions of the grid trenches Tg may be relatively steeply inclined, and the side surfaces of the lower portions of the grid trenches Tg may be relatively gently inclined. The anti-reflective layer 40 may be partially recessed in such a manner that the bottoms of the lower grid portions 51 of the grid trenches Tg are positioned in the anti-reflective layer 40.

Figure 8D:
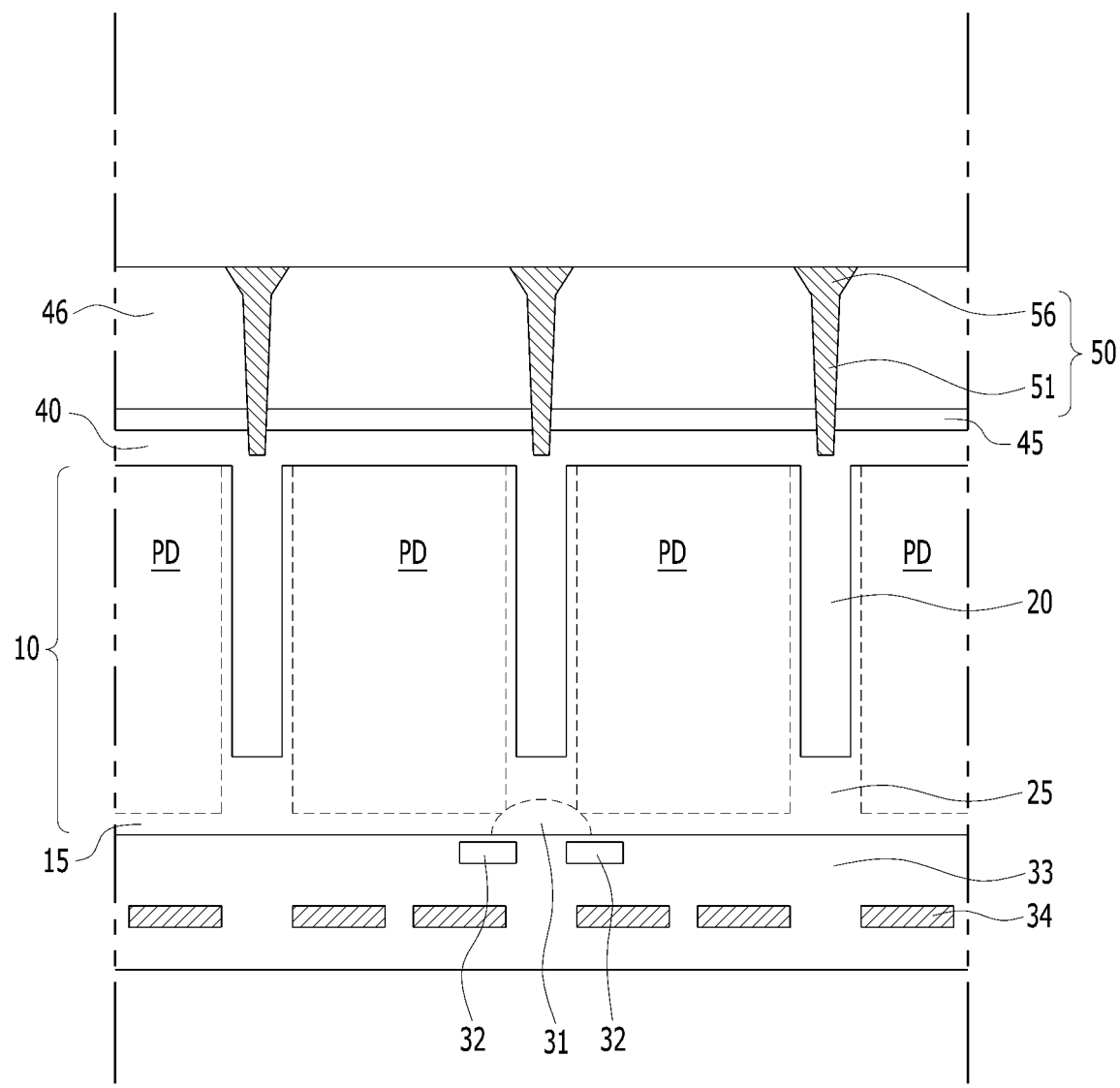

Referring to FIG. 8D, the method may include forming grid patterns 50 by filling the grid trenches Tg with a grid material, the grid patterns 50 each having a lower grid portion 51 and an upper grid portion 56. For example, the forming of the grid patterns 50 may include performing a deposition process and etching process, or performing a damascene process. In some implementations, the method may include performing a chemical mechanical polishing (CMP) process. The bottoms of the lower grid portions 51 of the grid trenches Tg may be embedded in the anti-reflective layer 40.

Figure 8E:
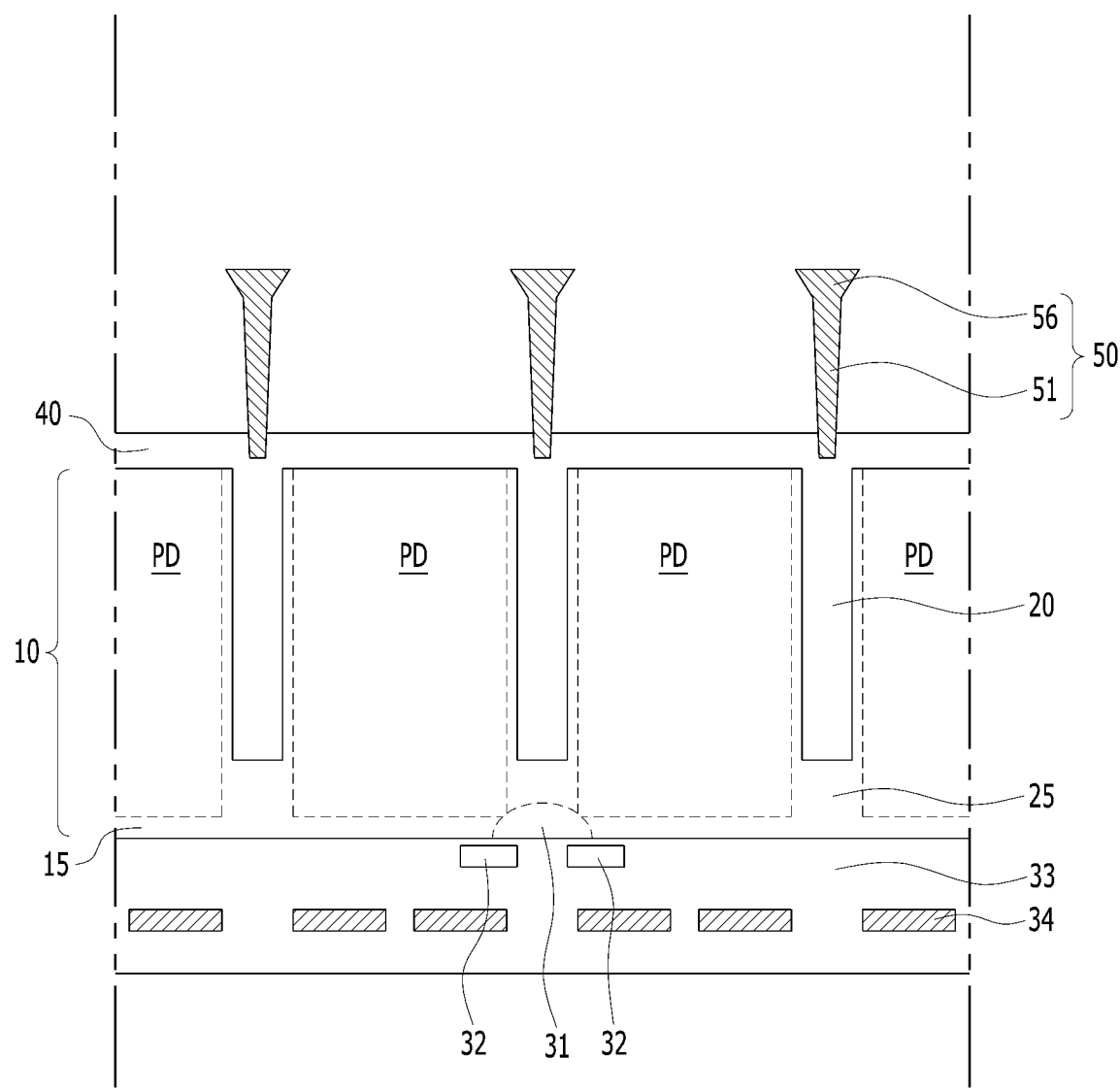

Referring to FIG. 8E, the method may include removing the mold layer 46 and the stopper layer 45 by performing an etching process. The etching process may include a first process for removing the mold layer 46 and a second process for removing the stopper layer 45. For example, each of the first and second processes may include a wet etching process.

Figure 8F:
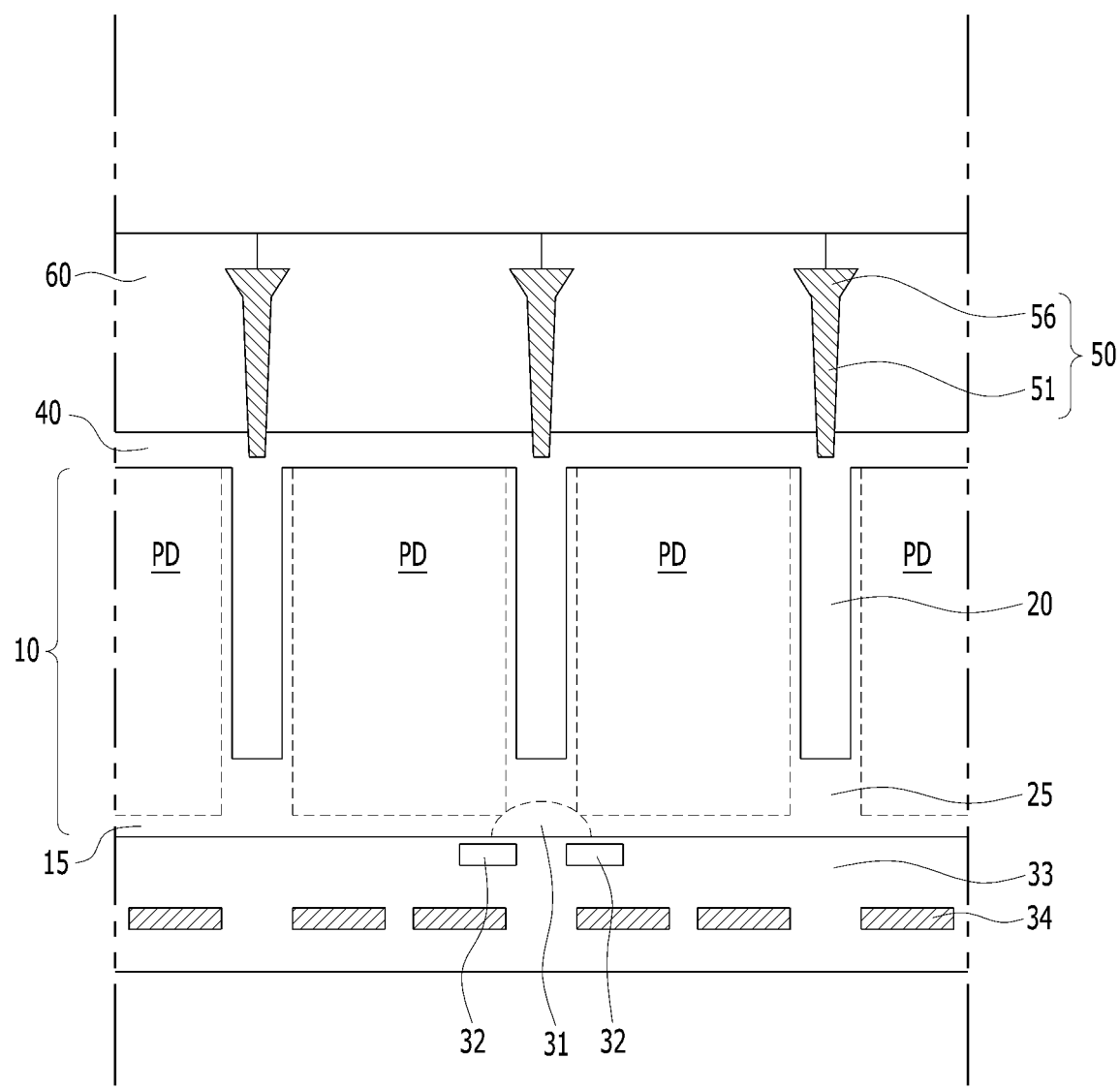

Referring to FIG. 8F, the method may include forming color filters 60 between the grid patterns 50. The forming of the color filters 60 may include forming pigment-containing resin between the grid patterns 50 and performing a photolithography process. Then, the method may include forming microlenses 65 on the color filters 60 with reference to FIG. 2.

Figure 9A:
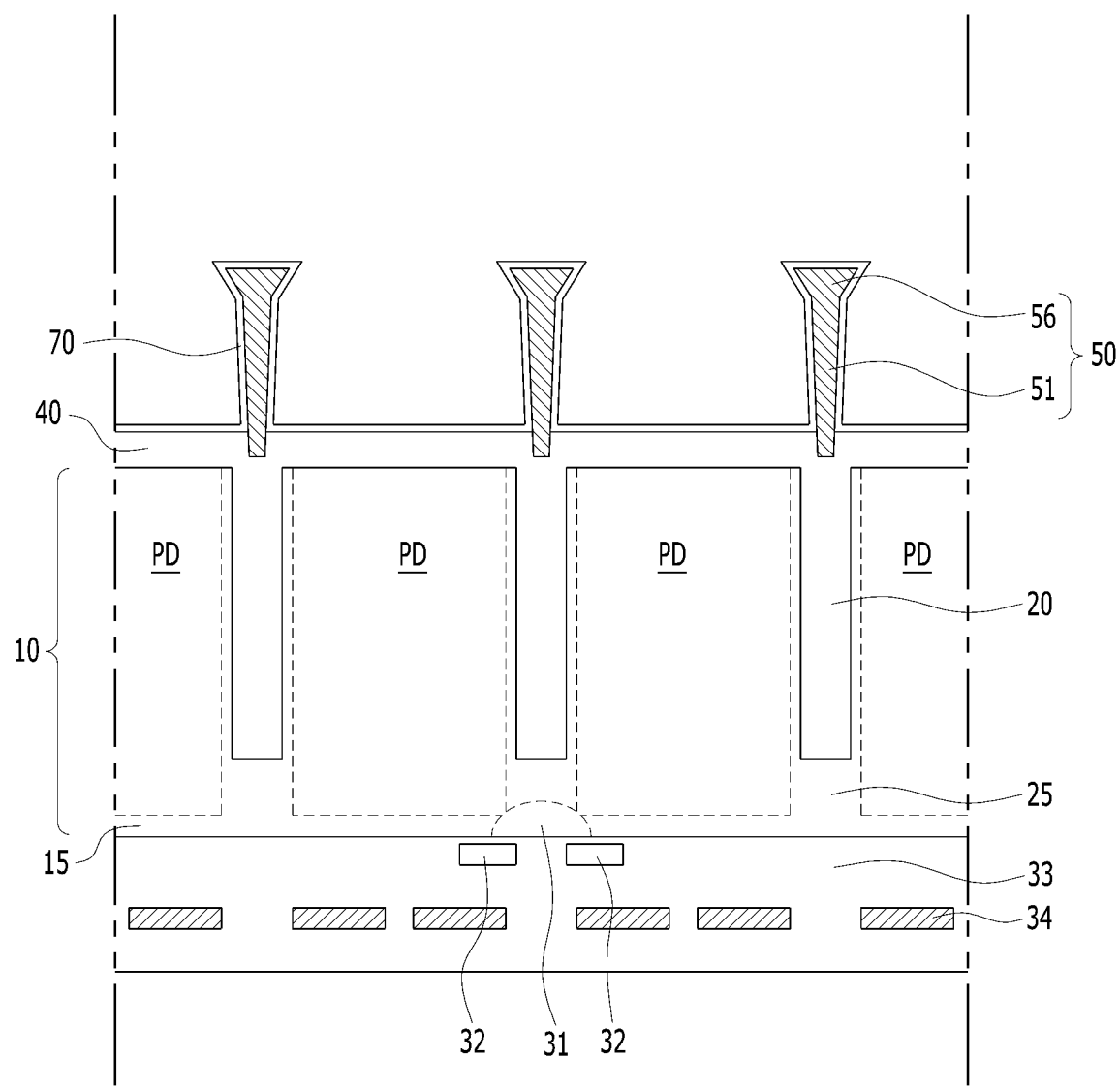
FIGS. 9A, 9B, 10A to 10C, 11A and 11B illustrate methods for fabricating an image sensor in accordance with various embodiments of the disclosed technology.
Figure 9B:
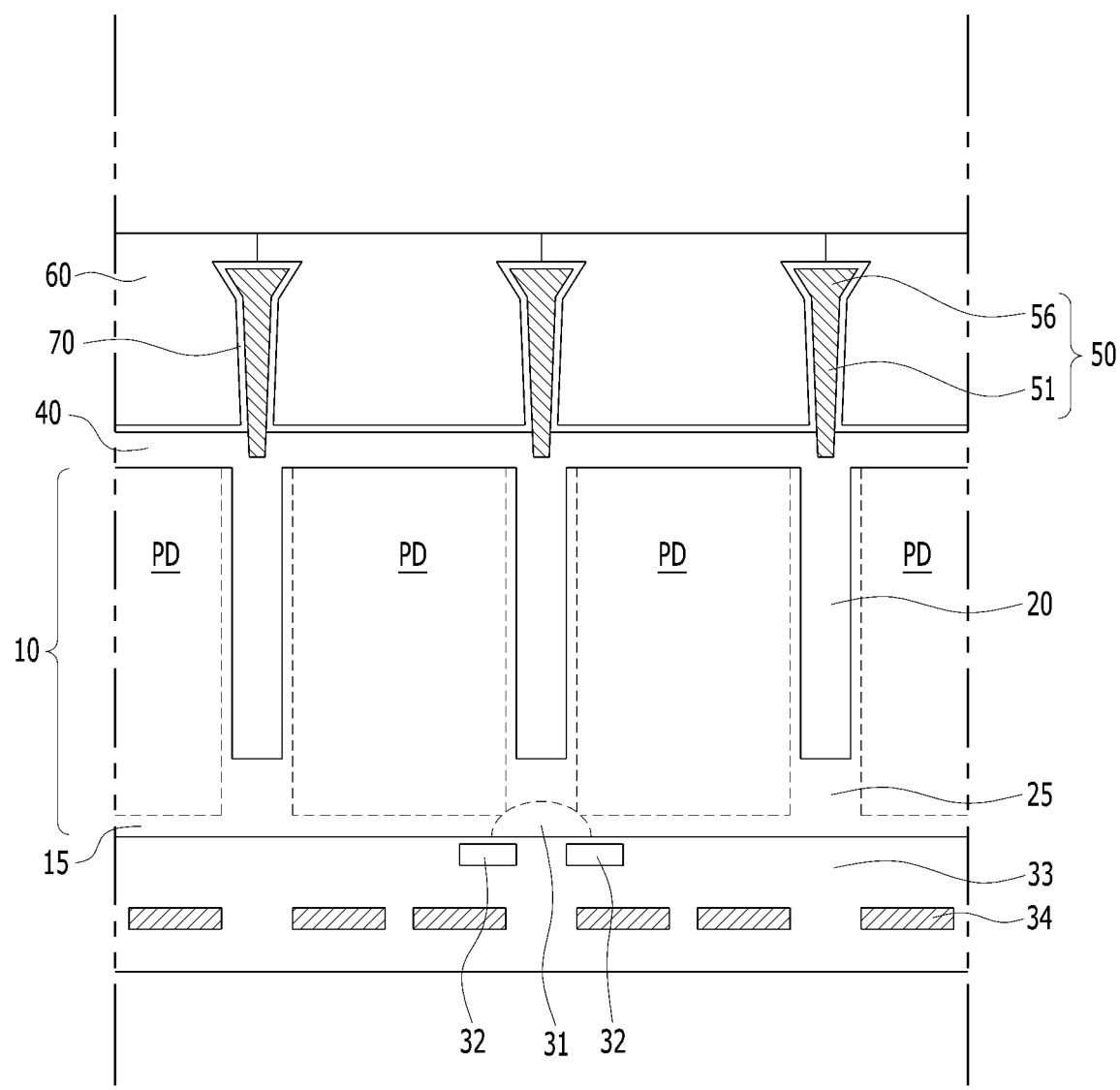

FIGS. 9A and 9B illustrate a method for fabricating an image sensor in accordance with an embodiment.

Referring to FIG. 9A, the method for fabricating the image senor may include forming photoelectric conversion elements PD, a surface doping region 15, a lower isolation region 25, a floating diffusion region 31, transfer gates 32, a lower interlayer dielectric layer 33, transfer wirings 34, an upper isolation region 20, an anti-reflective layer 40 and grid patterns 50 in a substrate 10 by performing the processes described with reference to FIGS. 8A to 8E, and forming a coating layer 70 on the top surface of the anti-reflective layer 40 and the surfaces of the grid patterns 50. The forming of the coating layer 70 may include performing a deposition process. The coating layer 70 may have a conformal liner shape. The coating layer 70 may have a single-layer or multilayer structure. For example, the coating layer 70 may include silicon oxynitride (SiON), silicon oxide ($SiO_2$), silicon nitride (SiN) or one of combinations thereof.

Referring to FIG. 9B, the method may include forming color filters 60 between the grid patterns 50. Then, the method may include forming microlenses 65 on the color filters 60 as described with reference to FIGS. 2 and 3B.

Figure 10A:
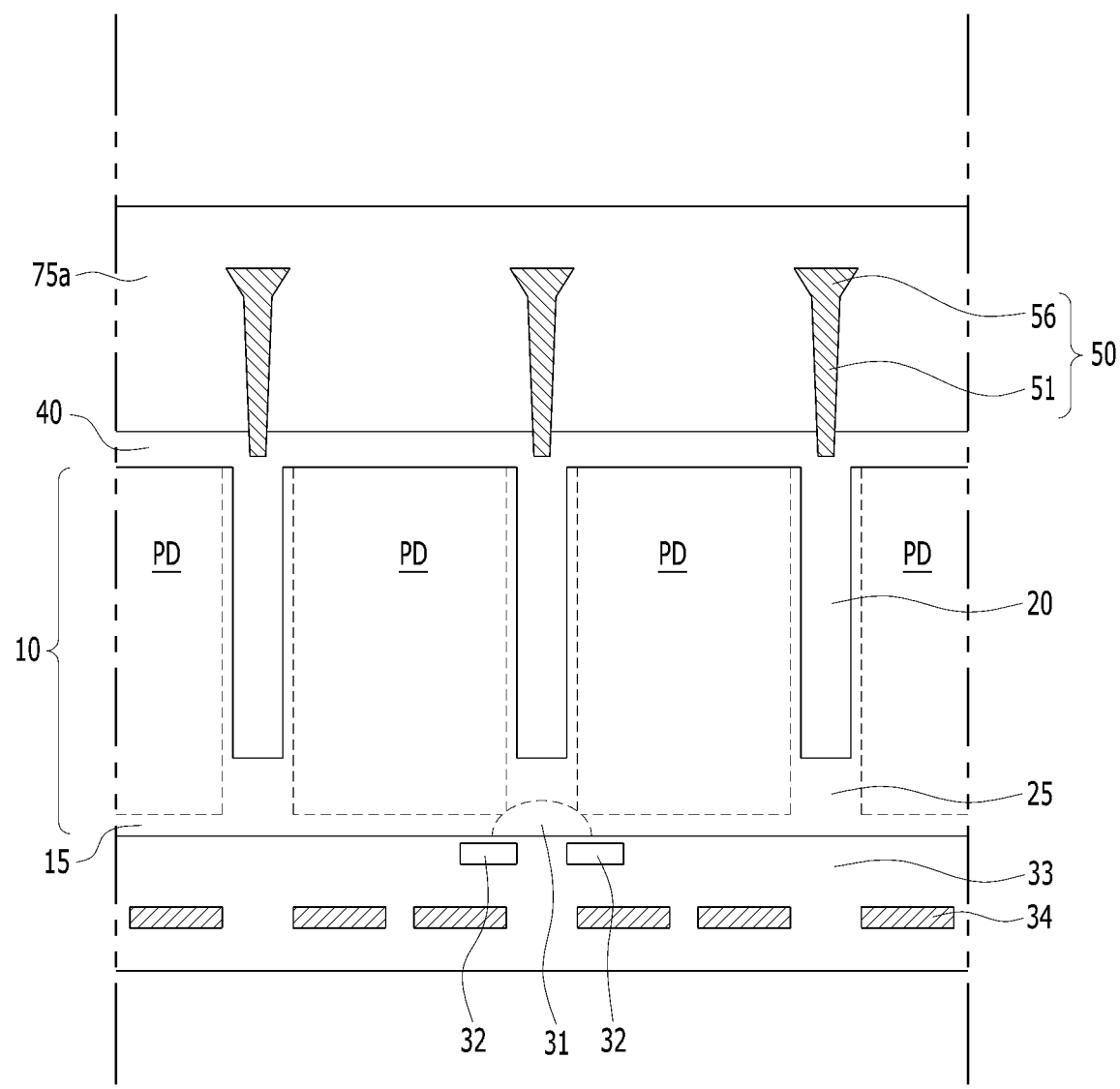
Figure 10B:
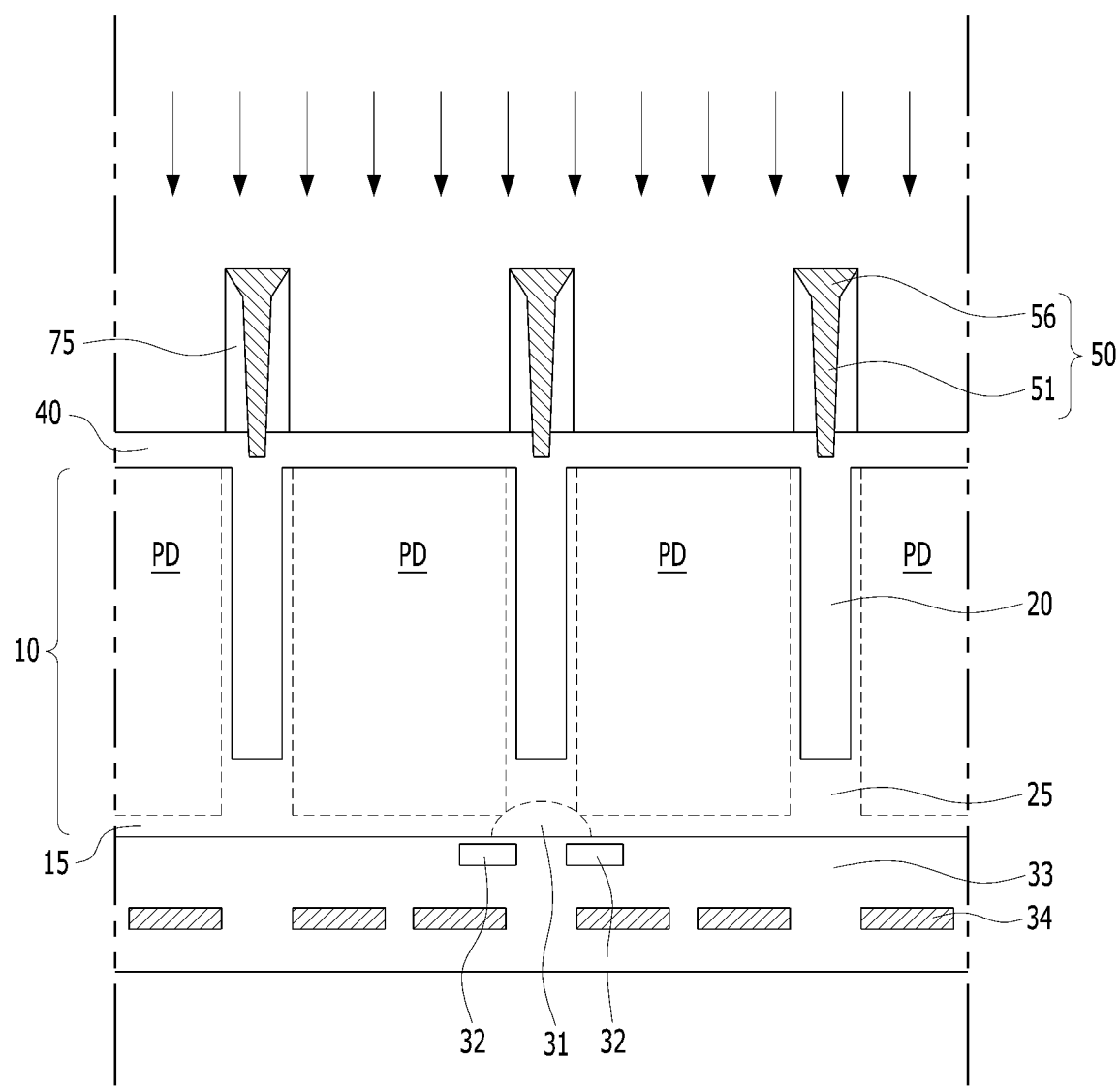
Figure 10C:
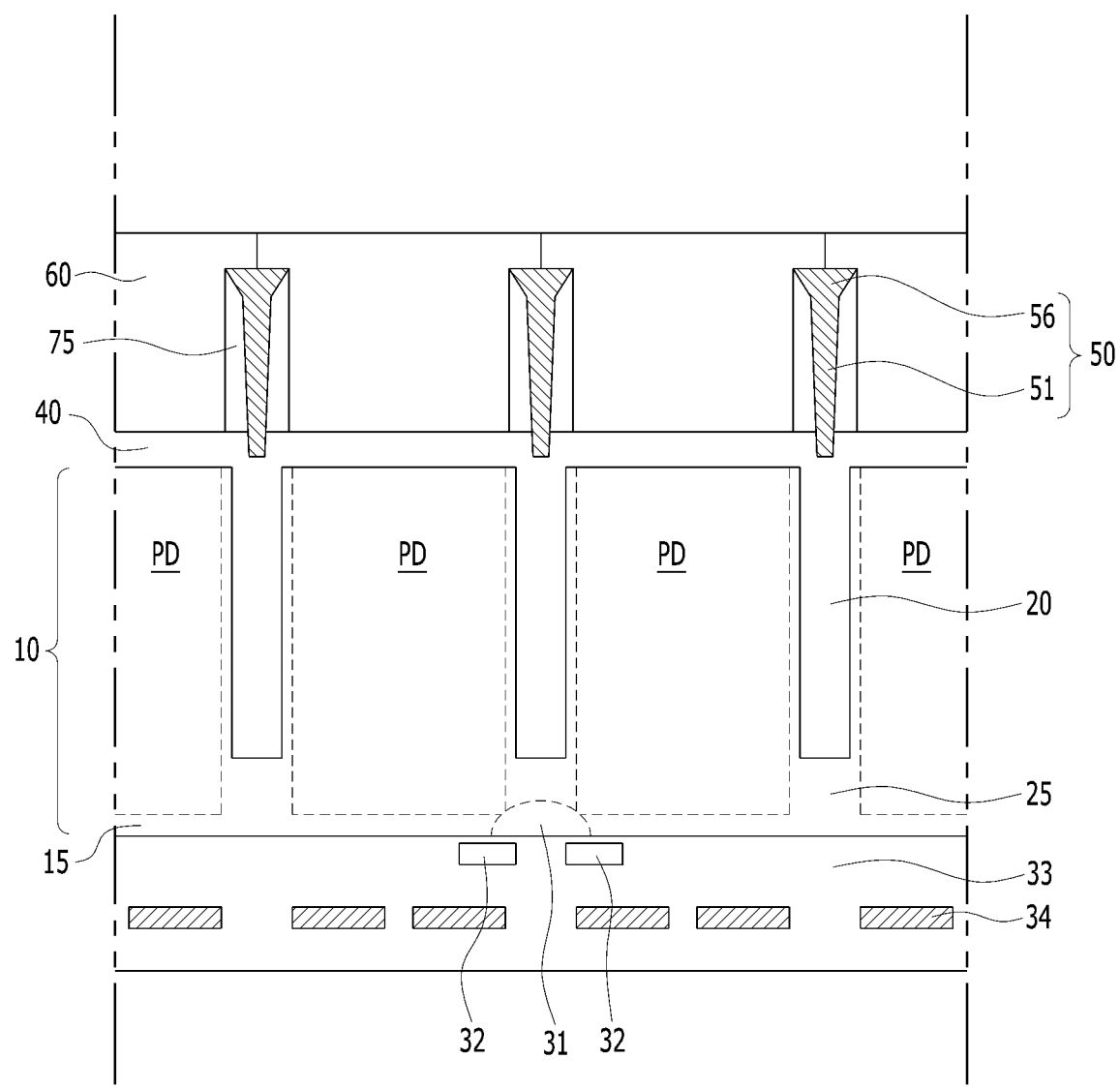

FIGS. 10A to 10C illustrate a method for fabricating an image sensor in accordance with an embodiment.

Referring to FIG. 10A, the method may include forming photoelectric conversion elements PD, a surface doping region 15, a lower isolation region 25, a floating diffusion region 31, transfer gates 32, a lower interlayer dielectric layer 33, transfer wirings 34, an upper isolation region 20, an anti-reflective layer 40 and grid patterns 50 in a substrate 10 by performing the processes described with reference to FIGS. 8A to 8E, and forming a low-refractive-index insulator 75a on the anti-reflective layer 40 through a coating process, such that the insulator 75a covers the grid patterns 50. The low-refractive-index insulator 75a may include a polymer organic material.

Referring to FIG. 10B, the method may include forming a side reflective layer 75 by isotropically etching the low-refractive-index insulator 75a. The side reflective layer 75 may be formed on the side surfaces of the grid patterns 50. The side reflective layer 75 may be formed under the upper grid portion 56 so as to have vertically flat side surfaces.

Therefore, the horizontal width of the top surface of the upper grid portion 56 of the grid pattern 50 may be similar or substantially equal to the horizontal width of the side reflective layer 75.

Referring to FIG. 10C, the method may include forming color filters 60 between the grid patterns 50. The color filters 60 may be in contact with the side reflective layers 75. The side reflective layers 75 may have a lower refractive index than that of the color filters 60. Then, the method may further include forming microlenses 65 on the color filters 60 as described with reference to FIGS. 4 and 5A.

Figure 11A:
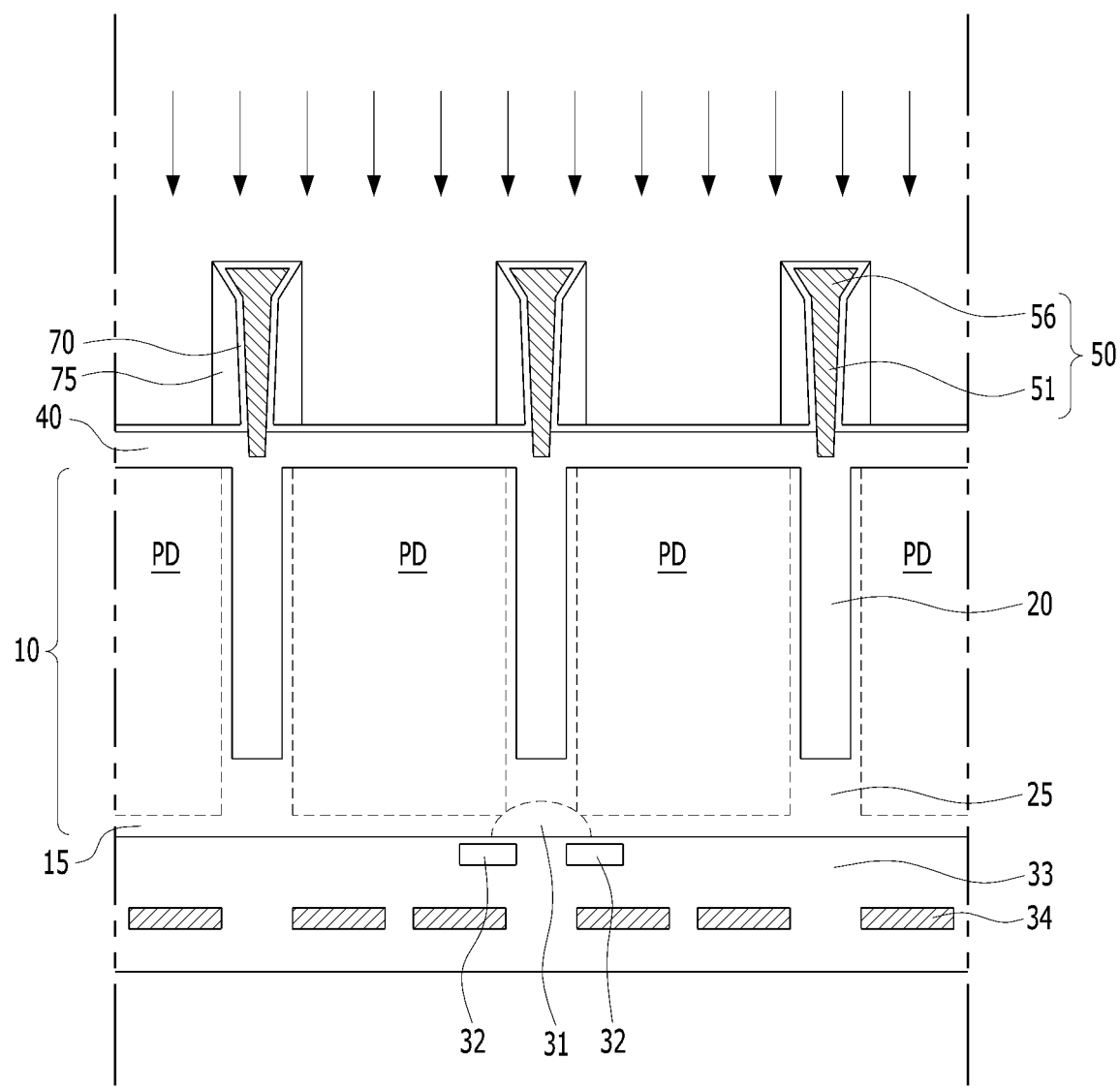
Figure 11B:
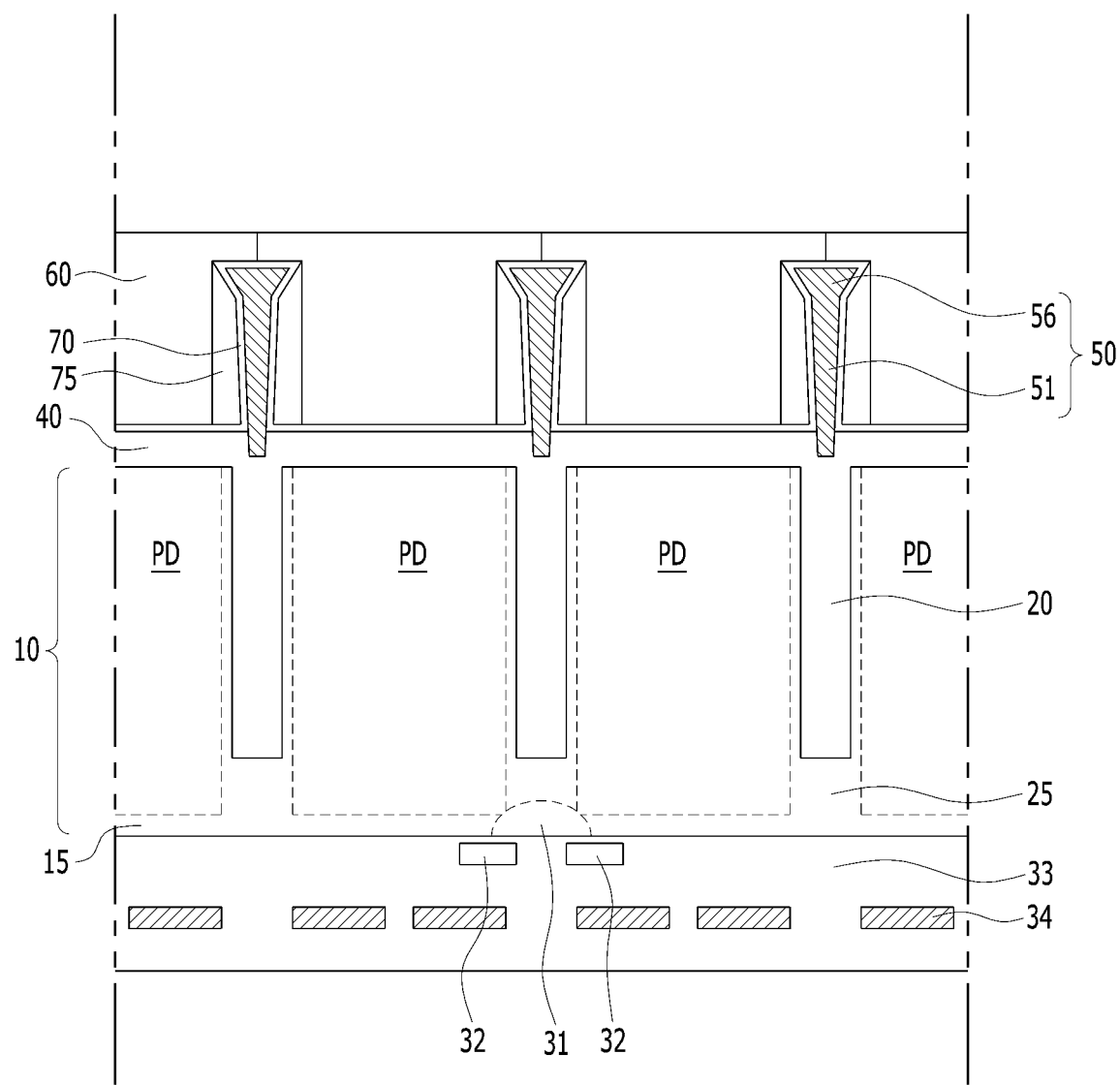

FIGS. 11A and 11B illustrate a method for fabricating an image sensor in accordance with an embodiment.

Referring to FIG. 11A, the method for fabricating the image senor may include forming photoelectric conversion elements PD, a surface doping region 15, a lower isolation region 25, a floating diffusion region 31, transfer gates 32, a lower interlayer dielectric layer 33, transfer wirings 34, an upper isolation region 20, an anti-reflective layer 40 and grid patterns 50 in a substrate 10 by performing the processes described with reference to FIGS. 8A to 8E, forming a coating layer 70 on the top surface of the anti-reflective layer 40 and the surfaces of the grid patterns 50 by performing the process described with reference to FIG. 9A, and forming a side reflective layer 75 by performing the processes described with reference to FIGS. 10A and 10B. The side reflective layer 75 may be directly formed on the coating layer 70 on the surfaces of the grid patterns 50. The processes for forming the respective components will be able to be understood with reference to other drawings.

Referring to FIG. 11B, the method may include forming color filters 60 between the grid patterns 50 or between the side reflective layers 75. Then, the method may include forming microlenses 65 on the color filters 60.

Figure 12:
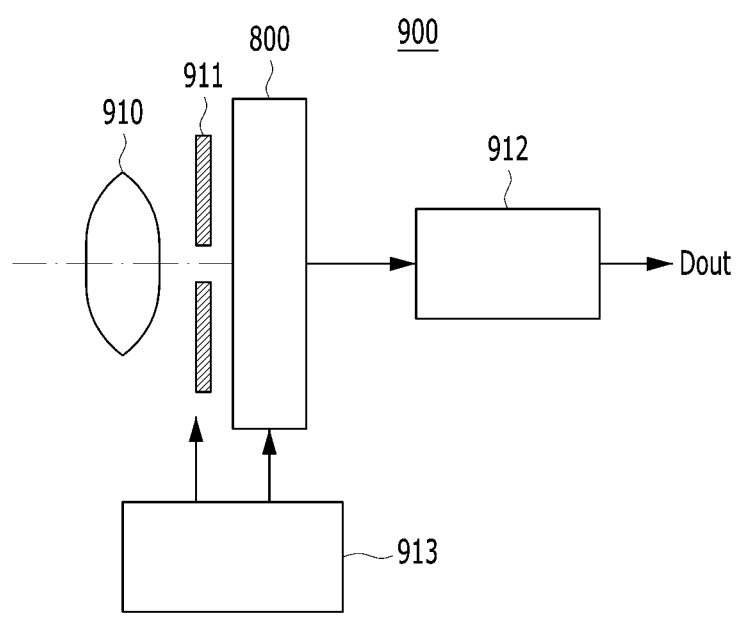
FIG. 12 is an example of a diagram schematically illustrating an electronic device with an image sensor in accordance with an embodiment of the disclosed technology.

FIG. 12 schematically illustrates a camera system 900 having one of the image sensors 100A to 100D in accordance with an embodiment. Referring to FIG. 12, the camera system 900 having one of various image sensors 100A to 100D in accordance with the present embodiment may take a still image or moving image. The camera system 900 may include an optical lens system 910, a shutter unit 911, an image sensor 800, a driver 913 and a signal processor 912. The driver 913 may control/drive the shutter unit 911. The image sensor 800 may include one of the image sensors 100A to 100D in accordance with the various embodiments. The camera system 900 may guide image light (incident light) Li from an object to a pixel array (refer to reference numeral '810' of FIG. 1) of the image sensor 800. The optical lens system 910 may include a plurality of optical lenses. The shutter unit 911 may control a light irradiation period and light shielding period for the image sensor 800. The driver 913 may control a transfer operation of the image sensor 800 and a shutter operation of the shutter unit 911. The signal processor 912 may process various types of signals outputted from the image sensor 800. The processed image signal Dout may be stored in a storage medium such as a memory, or outputted to a monitor or the like.

In accordance with the present embodiments, since the image sensors include grid patterns embedded in the anti-reflective layer, light can be prevented from crossing over to adjacent photoelectric conversion elements. Therefore, it is possible to prevent or reduce cross-talk between the adjacent photoelectric conversion elements.

Since the image sensors include the side reflective layer having a lower refractive index than that of the color filters, light can be prevented from being absorbed by the grid patterns and the like. Therefore, the quantum efficiency of the image sensor can be improved.

Although various embodiments have been described for illustrative purposes, it will be apparent to those skilled in the art that various changes and modifications may be made.

What is claimed is:

1. An image sensor comprising:
   photoelectric conversion elements formed in a substrate, each photoelectric conversion element responsive to light to produce a photo sensing electrical signal;
   isolation regions disposed between adjacent photoelectric conversion elements and configured to isolate the photoelectric conversion elements from one another;
   an anti-reflective layer formed over the substrate to reduce an optical reflection to facilitate optical transmission of light incident to the photoelectric conversion elements through the anti-reflective layer;
   grid patterns formed over the isolation regions to provide an optical separation between two adjacent photoelectric conversion elements;
   color filters arranged between the grid patterns, each color filter structured to select a designated color in the incident light to transmit through a corresponding photoelectric conversion element; and
   microlenses respectively formed over the color filters to direct incident light to the photoelectric conversion elements through the color filters,
   wherein each of the grid patterns comprises an upper grid portion and a lower grid portion disposed below the upper grid portion, and
   a bottom of the lower grid portion is embedded in the anti-reflective layer,
   wherein the upper grid portion has a larger horizontal width than that of a portion of the lower grid portion, the portion of the lower grid portion disposed between two adjacent color filters.

2. The image sensor of claim 1, wherein a side surface of the upper grid portion has a first inclination,
   a side surface of the lower grid portion has a second inclination, and
   the second inclination is more perpendicular to a surface of the substrate than the second inclination.

3. The image sensor of claim 1, further comprising:
   side reflective layers formed on side surfaces of the grid patterns.

4. The image sensor of claim 3, wherein the side reflective layers are in contact with the color filters.

5. The image sensor of claim 3, wherein the side reflective layers have a smaller refractive index than that of the color filters.

6. The image sensor of claim 3, wherein the top surface of the upper grid portion has substantially a same horizontal width as the side reflective layer.

7. The image sensor of claim 3, wherein the side reflective layer has vertically flat side surfaces.

8. The image sensor of claim 3, wherein the average horizontal thickness of the upper portion of the side reflective layer is smaller than the average horizontal thickness of the lower portion of the side reflective layer.

9. The image sensor of claim 3, further comprising:
   a coating layer formed in a liner shape on the top surface of the anti-reflective layer and the surfaces of the grid patterns.

10. The image sensor of claim 9, wherein the side reflective layer has a lower refractive index than that of the coating layer.

11. The image sensor of claim 1, wherein each of the isolation regions comprises a lower isolation region and an upper isolation region, and
the lower isolation region comprises an ion implanted region, and the upper isolation region comprises unit isolation regions formed in an isolation trench formed in the substrate.

12. The image sensor of claim 11, wherein the unit isolation regions comprise an outer unit isolation region, a middle unit isolation region and an inner unit isolation region that are formed in the isolation trench, and
the outer unit isolation region covers the side surface of the middle unit isolation region, and the middle unit isolation region covers the side surface of the inner unit isolation region.

13. The image sensor of claim 12, wherein the anti-reflective layer comprises a lower unit anti-reflective layer, a middle unit anti-reflective layer and an upper unit anti-reflective layer.

14. The image sensor of claim 13, wherein the lower unit anti-reflective layer and the outer unit isolation region include a first material,
the middle unit anti-reflective layer and the middle unit isolation region include a second material, and
the upper unit anti-reflective layer and the inner unit isolation region include a third material.

15. An image sensor, comprising:
photoelectric conversion elements formed in a substrate, each photoelectric conversion element responsive to light to produce a photo sensing electrical signal;
isolation regions disposed between adjacent photoelectric conversion elements and configured to isolate the photoelectric conversion elements from one another;
an anti-reflective layer formed over the substrate to reduce an optical reflection to facilitate optical transmission of light incident to the photoelectric conversion elements through the anti-reflective layer;
grid patterns formed over the isolation regions to separate space above the photoelectric conversion elements;
color filters arranged between the grid patterns, each color filter structured to select a designated color in the incident light to transmit through a corresponding photoelectric conversion element; and
microlenses respectively formed over the color filters to direct incident light to the photoelectric conversion elements through the color filters,
wherein each of the grid patterns comprises an upper grid portion and a lower grid portion disposed below the upper grid portion, and
a bottom of the lower grid portion is embedded in the anti-reflective layer,
wherein a side surface of the upper grid portion has a first inclination,
a side surface of the lower grid portion has a second inclination, and
the second inclination is more perpendicular to a surface of the substrate than the second inclination.

16. An image sensor comprising:
photoelectric conversion elements formed in a substrate, each photoelectric conversion element responsive to light to produce a photo sensing electrical signal;
isolation regions disposed between adjacent photoelectric conversion elements and configured to isolate the photoelectric conversion elements from one another;
an anti-reflective layer formed over the substrate to reduce an optical reflection to facilitate optical transmission of light incident to the photoelectric conversion elements through the anti-reflective layer;
grid patterns formed over the isolation regions to separate space above the photoelectric conversion elements;
color filters arranged between the grid patterns, each color filter structured to select a designated color in the incident light to transmit through a corresponding photoelectric conversion element; and
microlenses respectively formed over the color filters to direct incident light to the photoelectric conversion elements through the color filters,
wherein each of the grid patterns comprises an upper grid portion and a lower grid portion disposed below the upper grid portion, and
a bottom of the lower grid portion is embedded in the anti-reflective layer,
wherein each of the isolation regions comprises a lower isolation region and an upper isolation region, and
the lower isolation region comprises an ion implanted region, and the upper isolation region comprises unit isolation regions formed in an isolation trench formed in the substrate.

* * * * *